(12) United States Patent
Hisada

(10) Patent No.: US 8,325,286 B2
(45) Date of Patent: Dec. 4, 2012

(54) ACTIVE MATRIX SUBSTRATE AND DISPLAY DEVICE INCLUDING THE SAME

(75) Inventor: Yuhko Hisada, Matsuzaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 372 days.

(21) Appl. No.: 12/561,296

(22) Filed: Sep. 17, 2009

(65) Prior Publication Data

US 2010/0001279 A1    Jan. 7, 2010

Related U.S. Application Data

(63) Continuation of application No. 11/908,499, filed as application No. PCT/JP2006/304255 on Mar. 6, 2006, now Pat. No. 7,612,839.

(30) Foreign Application Priority Data

Mar. 15, 2005 (JP) .................................. 2005-72847

(51) Int. Cl.
*G02F 1/136* (2006.01)
(52) U.S. Cl. ......................................................... 349/48
(58) Field of Classification Search ...................... 349/48
See application file for complete search history.

(56) References Cited

U.S. PATENT DOCUMENTS 5,394,258 A * 2/1995 Morin et al. ..................... 349/38
6,191,831 B1 * 2/2001 Kim et al. ........................ 349/43

OTHER PUBLICATIONS

Hisada; "Active Matrix Substrate and Display Device Including the Same"; U.S. Appl. No. 11/908,499, filed Sep. 13, 2007.

* cited by examiner

*Primary Examiner* — Phu Vu
(74) *Attorney, Agent, or Firm* — Keating & Bennett, LLP

(57) ABSTRACT

It is possible to decrease block segmentation and flickering due to separate exposure in an active matrix substrate while avoiding decreased aperture ratio, increased parasitic capacity and complication in manufacturing process. A first pixel circuit and a second pixel circuit including a first-type TFT and a second-type TFT, respectively, are disposed alternately relative to each other in both directions of row and column in an active matrix substrate. In the first-type and the second-type TFTs, a pattern misalignment of the drain electrode with respect to the gate electrode in an up-down direction will increase/decrease a gate-drain parasitic capacity Cgd in reverse ways. By disposing these two types of TFTs in uniform dispersion, the increase/decrease in the parasitic capacity Cgd caused by pattern misalignment occurring at the time of manufacture are averaged.

26 Claims, 21 Drawing Sheets

|  | First-type TFT | Second-type TFT | Average level shift in the region |
|---|---|---|---|
| Region A | Small Cgd | Large Cgd | $\Delta Vd0$ |
| Region B | No change | No change | $\Delta Vd0$ |
| Region C | Large Cgd | Small Cgd | $\Delta Vd0$ |

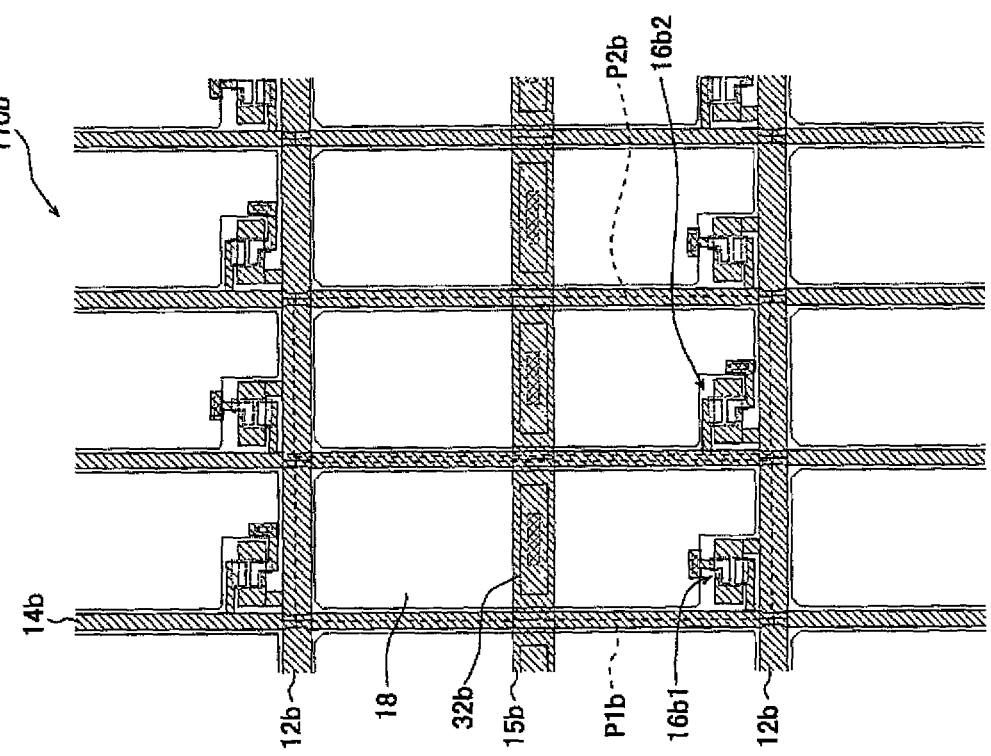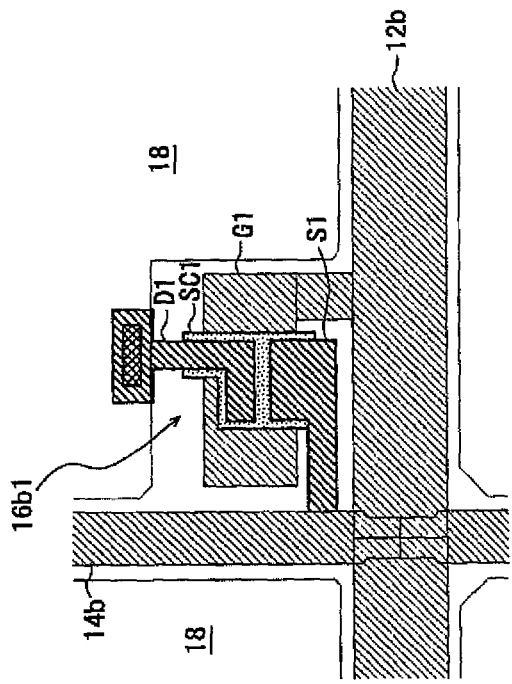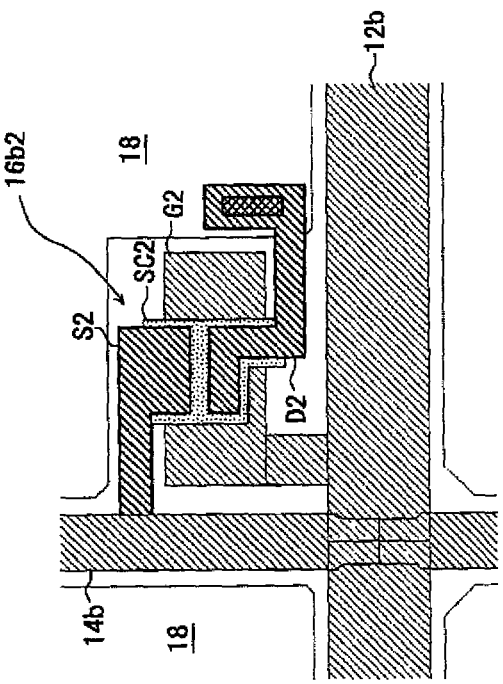

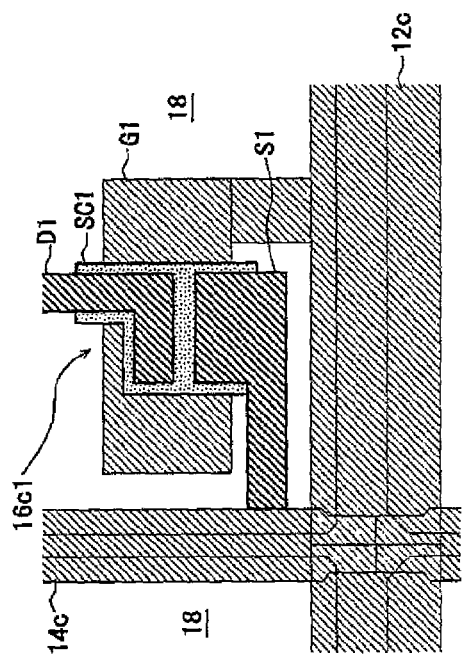
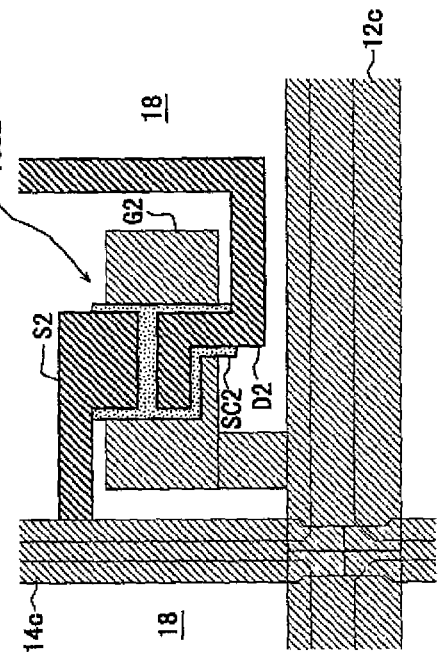
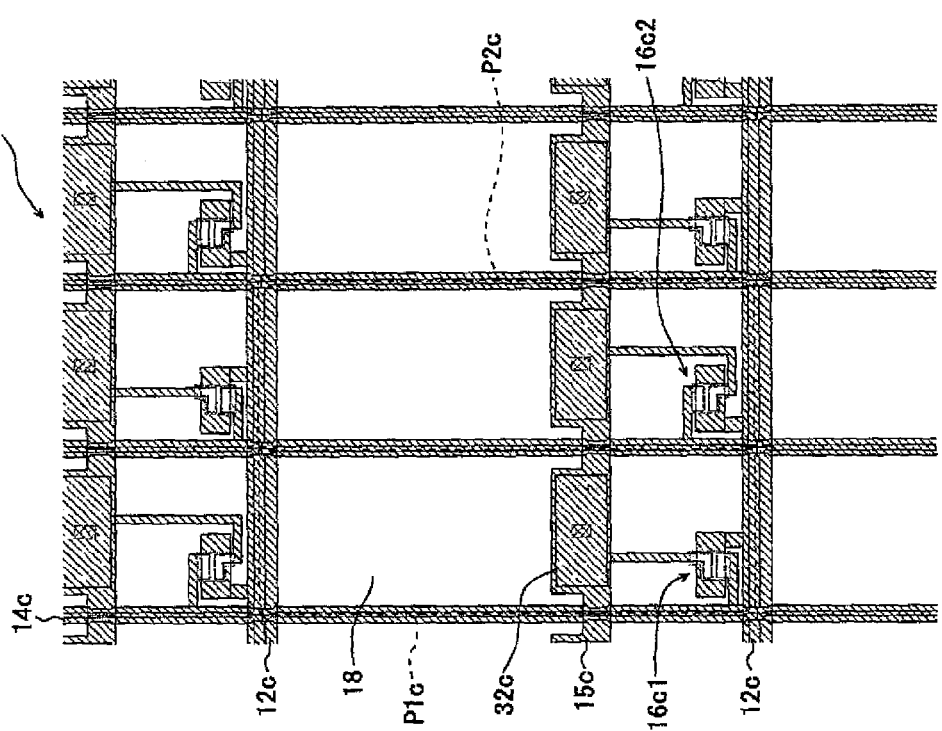
FIG. 11B
FIG. 11C
FIG. 11A

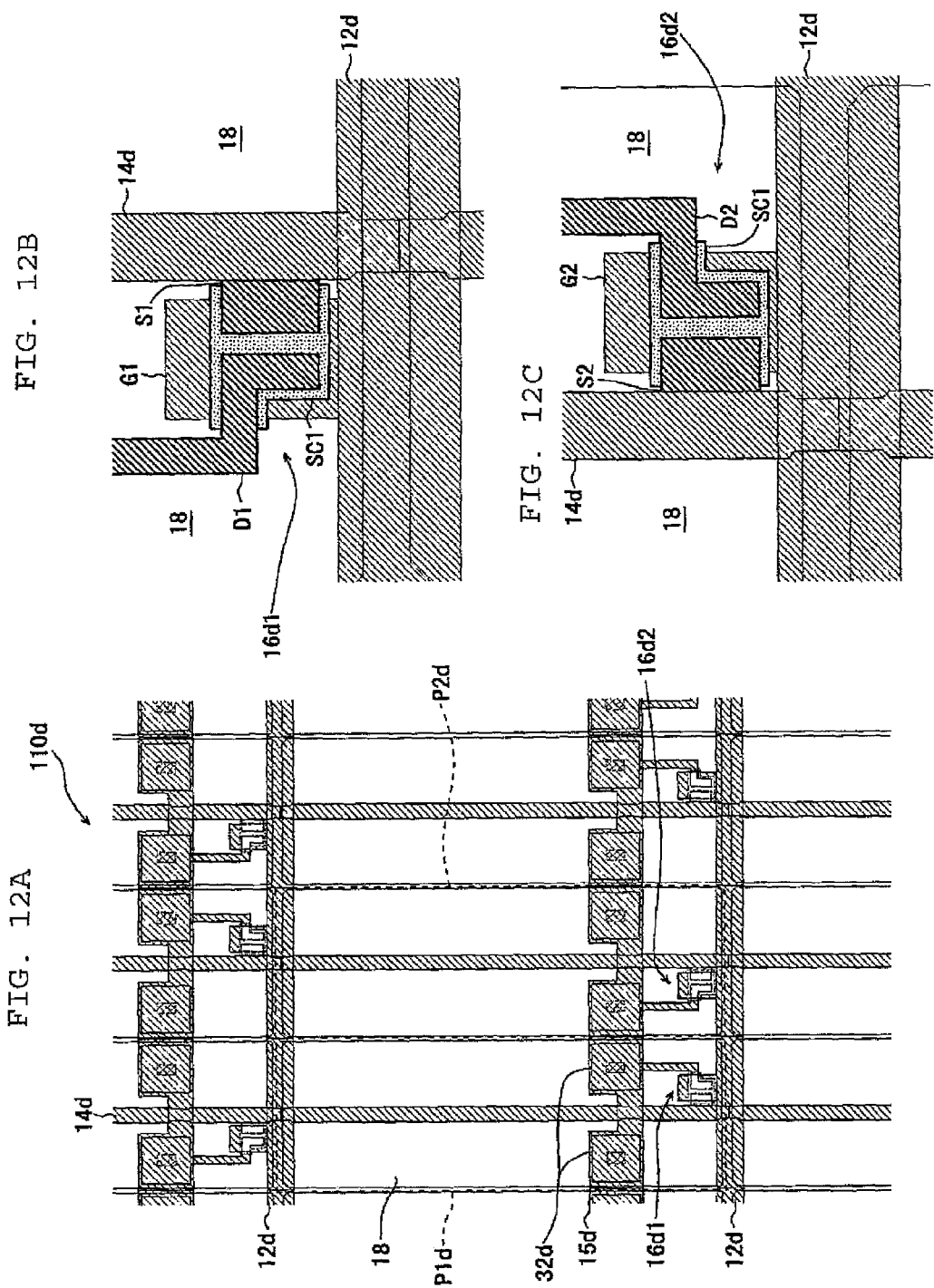

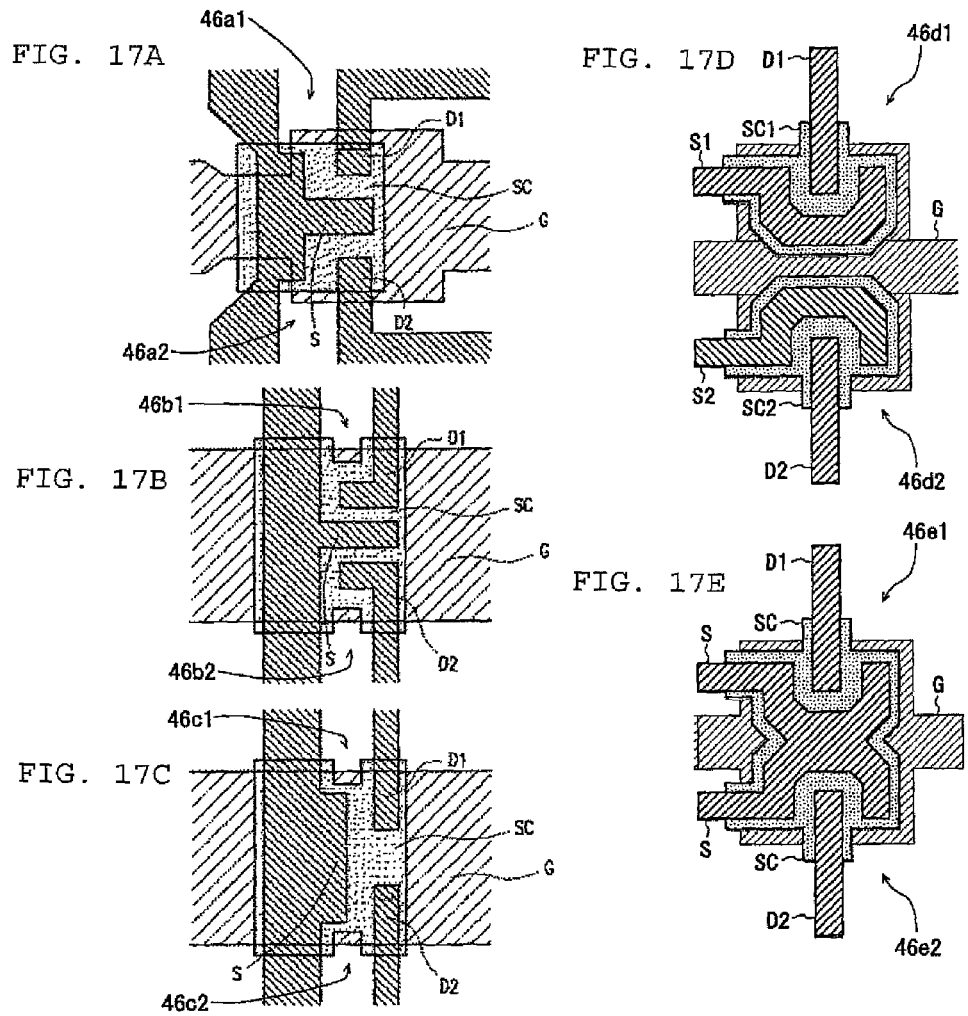

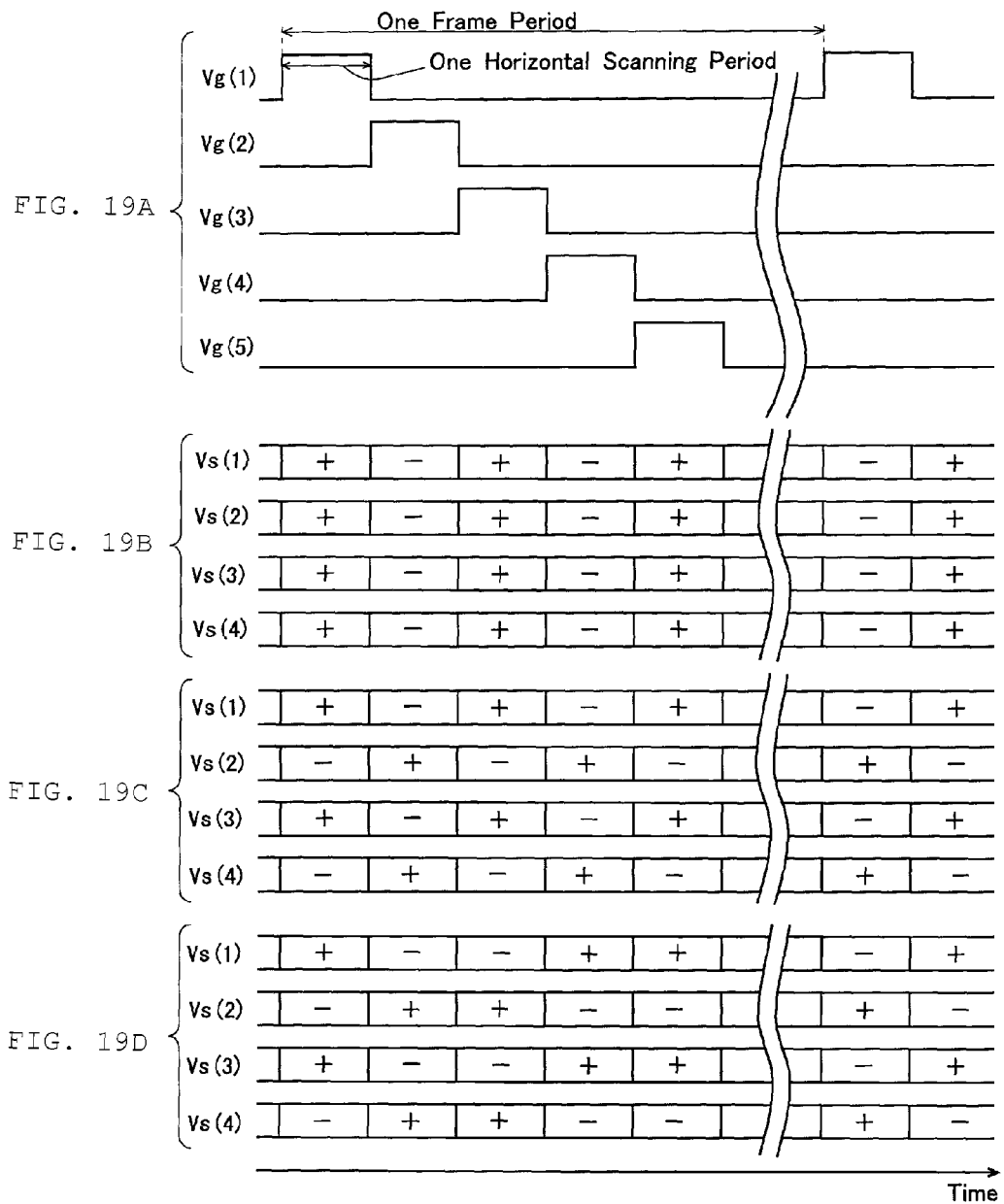

ACTIVE MATRIX SUBSTRATE AND DISPLAY DEVICE INCLUDING THE SAME

BACKGROUND OF THE INVENTION

1. Field of the Invention

The present invention relates to active matrix substrates used in matrix type liquid crystal display devices, EL (electroluminescence) display devices, etc. More specifically, the present invention relates to an active matrix substrate which includes: a plurality of data signal lines and a plurality of scanning signal lines disposed in a grid pattern that provide intersections; and a matrix of pixel circuits each corresponding to one of the intersections and having a switching element provided by, e.g., a field-effect transistor such as a thin-film transistor, and a voltage holding capacitor; and relates also to a display device which includes the active matrix substrate.

2. Description of the Related Art

Active matrix substrates are utilized widely in active matrix type display devices such as liquid crystal display devices and EL display devices, as well as active matrix type sensors. In particular, liquid crystal display devices which include display pixels each having a switching element provided by a field-effect transistor such as a thin-film transistor (hereinafter abbreviated as "TFT") gather special attention because of their ability to provide superb display image without crosstalk even if the number of display pixels is increased.

A matrix type liquid crystal display device such as the above includes, principally, a liquid crystal display panel and a drive circuit therefor. The liquid crystal display panel has a pair of electrode substrates sandwiching a liquid crystal layer, and each of the electrode substrates has its outer surface provided with a polarizer plate.

One of the electrode substrates is an active matrix substrate called a TFT substrate. The TFT substrate includes an insulating substrate provided by glass for example, on which a plurality of data signal lines and a plurality of scanning signal lines are formed to intersect with each other. Further, a plurality of auxiliary capacity lines are formed in parallel to the scanning signal lines. Also, a plurality of pixel circuits, each corresponding to one of the intersections made by the data signal lines and the scanning signal lines, are formed in a matrix pattern. Each of the pixel circuits includes: a pixel electrode which corresponds to a pixel as a constituent of an image to be displayed; a pixel capacity formed by the pixel electrode and an opposed electrode and other components to be described later; and a TFT serving as a switching element. The other of the electrode substrates is called an opposed substrate, and is provided by an insulating, transparent substrate such as glass, and its entire surface is provided with an opposed electrode and an alignment film formed in this sequence.

An active matrix type liquid crystal display device includes, as drive circuitry for the liquid crystal display panel of the above-described configuration, a scanning signal line drive circuit connected with the scanning signal lines, a data signal line drive circuit connected with the data signal lines, an auxiliary capacity line drive circuit connected with the auxiliary capacity lines, and an opposed electrode drive circuit connected with the opposed electrode.

The data signal line drive circuit generates, based on image signals received from an outside signal source for example, a plurality of data signals sequentially in the form of analog voltage which represent pixel values in each horizontal scanning line of the image to be displayed in the liquid crystal display panel, and applies these data signals respectively to the data signal lines in the liquid crystal display panel. The scanning signal line drive circuit sequentially selects the scanning signal lines in the liquid crystal display panel for each horizontal scanning period, and applies an active scanning signal (a voltage which turns ON the TFT in the pixel circuit) to the selected scanning signal line, in each frame period (each vertical scanning period) for displaying an image on the liquid crystal display panel. The auxiliary capacity line drive circuit and the opposed electrode drive circuit apply signals to the auxiliary capacity lines and the opposed electrode respectively, and these signals give electric potentials that serve as baseline voltages for the voltages to be applied to the liquid crystal layer of the liquid crystal display panel.

As described above, the data signal lines are supplied with respective data signals, and the scanning signal lines are supplied with respective scanning signals, whereby the pixel electrode in each pixel circuit of the liquid crystal display panel is supplied with a voltage representing the value of the pixel for the image to be displayed via the TFT, with the electric potential at the opposed electrode serving as the baseline voltage, and the supplied voltage is held at the pixel capacity in each pixel circuit. Thus, a voltage which is equal to the potential difference between the pixel electrode and the opposed electrode is applied to the liquid crystal layer. By controlling optical transmittance based on this applied voltage, the liquid crystal display panel displays an image represented by the image signals received from e.g. an outside signal source.

When manufacturing an active matrix substrate for use in such a liquid crystal display device as described above, the manufacturing process makes use of photolithography to form patterns of electrodes, wiring, insulation films, etc. for implementing the scanning signal lines, the data signal lines, the TFT, etc. on an insulating substrate made of glass for example. When manufacturing a large active matrix substrate for use in a liquid crystal display device which has a large display screen, the area of the insulating substrate on which the patterns are to be formed is divided into a plurality of regions, and an exposure step is performed separately, i.e. individually to each of the segmented regions. Generally, the exposure step, performed by using exposure equipment such as a stepper, involves various error factors in terms of stage positioning accuracy, focus level, etc., and these factors cause inconsistency in relative positions (positional relationships) between the patterns (layers). This means that the relative positional inconsistency between the patterns in different layers (hereinafter called "pattern misalignment") differs in its extent and direction, among the segmented regions into which the entire screen region was divided for the purpose of separate exposure.

FIG. 22 shows a configuration of a pixel circuit in a TFT substrate serving as an active matrix substrate used in a liquid crystal display device as described above. Each pixel circuit P(i, j) corresponds to one of the intersections made by the data signal lines and the scanning signal lines, and includes: a TFT 16 which has a source electrode connected with a data signal line S(i) passing the corresponding intersection; a gate electrode which is connected with a scanning signal line G(j) passing the same intersection; and a pixel electrode 18 connected with a drain electrode of the TFT 16. The pixel electrode 18 and an opposed electrode Ec form a liquid crystal capacity Clc. The pixel electrode 18 and an auxiliary capacity line CS(j) provided along the scanning signal line G(j) form an auxiliary capacity Cs, and the pixel electrode 18 and the scanning signal line G(j) form a parasitic capacity Cgd.

The parasitic capacity Cgd is an electrostatic capacitance between the gate electrode and the drain electrode of the TFT 16a in each pixel circuit P(i, j) (hereinafter, this parasitic capacity Cgd may also be called "gate-drain capacity"), and its value depends on the area of overlap resulted from the lithographical patterning steps in the above-described manufacturing process, or more specifically, depends on the area of overlap (hereinafter, called "the area of overlapping") made by the gate electrode (or gate wiring as the scanning signal lines) and the drain electrode (or the pixel electrode 18) via the insulation layer. As mentioned earlier, the extent and direction of pattern misalignment are different from one segmented region to another, depending on the region for which division was made for the separate exposure. In other words, the area of overlapping differs from one segmented region to another, and the value of parasitic capacity Cgd in the pixel circuits differs from one segmented region to another.

Also, since there is a parasitic capacity Cgd as described above between the scanning signal line G(j) and the pixel electrode 18 in each pixel circuit P(i, j) as shown in FIG. 22, the following phenomenon results. Specifically, if a data signal Vs(i) as shown in FIG. 23B is applied to the data signal line S(i), a fall of the voltage in a scanning signal Vg(j) as shown in FIG. 23A, from a gate ON voltage Vgh to a gate OFF voltage Vgl, will cause a level shift $\Delta$Vd as shown in FIG. 23C, in the electric potential of the pixel electrode (pixel electric potential) Vd due to the parasitic capacity Cgd. (This $\Delta$Vd is also called "field-through voltage.") The level shift $\Delta$Vd is given by the following mathematical expression:

$$\Delta Vd = (Vgh - Vgl) \cdot Cgd/(Clc + Cs + Cgd) \quad (1)$$

The parasitic capacity Cgd, i.e. the gate-drain capacity Cgd, in the mathematical expression given above differs from one segmented region to another corresponding to segmentation at the time of separate exposure as already described, and therefore, the level shift $\Delta$Vd also differs among these segmented regions. As a result, the same data signal will cause different transmissivity (display luminance) of the liquid crystal layer in different segmented regions, in a liquid crystal display device which uses such an active matrix substrate. This phenomenon, which is sometimes called "block segmentation" (or "tiling"), decreases display quality. There is a further implication in the liquid crystal display device in which polarity of the voltage applied to the liquid crystal layer is inversed for each predetermined period. Specifically, in this inversion arrangement, electric potential of the opposed electrode is made lower than the center potential of the data signal line by an amount of the above-described level shift, so that the voltage applied to the liquid crystal will be substantially symmetric in positive and negative polarities. Therefore, differences in the level shift $\Delta$Vd among the segmented regions will unavoidably result in a situation that the asymmetry correction is imperfect in some of the regions, leading to a problem of flickering (of the display) which decreases display quality.

There have been a number of proposals in an attempt to solve such a problem. For example, Patent Document 1 listed below discloses an active matrix substrate as a background of that patented invention, where a pixel formation portion (hereinafter may also called "pixel" for simplicity) is constituted by two subpixels. Each of the two subpixels is provided with a TFT switching element, and the two TFTs are built in such a way that their capacities, which are equivalent to the parasitic capacity Cgd and are held in the two respective subpixels, will have values of a reverse relationship in terms of increase/decrease with respect to the pattern misalignment in a given direction (See FIG. 8 in Patent Document 1, for example).

In another proposal which was made also in an attempt to solve the above-described problems, an active matrix type display device has for each pixel a new capacity (called "compensating capacity" for example) which makes up for the difference caused by pattern misalignment of a parasitic capacity that is equivalent to the parasitic capacity Cgd. A compensating capacity is connected in parallel to the parasitic capacity, so that there is always a constant sum of the parasitic capacity and the compensating capacity even if there is a pattern misalignment. (See Patent Documents 1, 2 and 3 for example, listed below.)

Further, Patent Document 4 listed below proposes a delta-arrangement liquid crystal display panel including an active matrix substrate in which self-alignment formation technique is utilized in making TFT channel regions in order to reduce unnecessary parasitic capacities thereby reducing inconsistency among the parasitic capacities due to separate exposure, etc.

Still further, Patent Document 5 listed below proposes a TFT array substrate as an active matrix substrate, where each pixel has a TFT which has a narrow part that straddles over a semiconductor layer and a gate electrode end of drain wiring formed on the semiconductor layer. The narrow part is narrower than a TFT channel width, i.e., a drain electrode width.

Patent Document 1 U.S. Pat. No. 5,285,302
Patent Document 2 JP-A 6-27487 Gazette
Patent Document 3 JP-A 6-110081 Gazette
Patent Document 4 JP-A 8-87026 Gazette
Patent Document 5 JP-A 2002-14371 Gazette However, active matrix substrates such as those disclosed in Patent Documents 1 through 3 have a problem. Specifically, these substrates use an arrangement that each pixel is constituted by a plurality of subpixels each including a TFT, whereby an increase/decrease in the gate-drain capacity Cgd, i.e. in the parasitic capacity due to pattern misalignment, is reduced within each pixel; or that each pixel has a new capacity (compensating capacity for example) which compensates for an increase/decrease in the gate-drain capacity Cgd, i.e. in the parasitic capacity. These arrangements which require formation of a TFT in each of the subpixels or formation of a new capacity in each pixel result in increased area of non-light-transmittance (e.g. the area occupied by the TFTs) in each of the pixels. This means that a liquid crystal display panel which uses the active matrix substrate has a decreased aperture ratio.

Also, the above-described conventional active matrix substrates have an increased parasitic capacity Cgd per pixel as a result of the formation of a TFT and the formation of a new capacity in each pixel. This also increases the level shift $\Delta$Vd (absolute value) (of the pixel electric potential) given by the mathematical expression (1), making it difficult to correct the level shift $\Delta$Vd by an electric potential Vcom applied to the opposed electrode Ec, resulting in such problems as deterioration of the liquid crystal caused by a direct current component applied to the liquid crystal layer, decreased display quality caused by flickering, etc. Another problem caused by increased parasitic capacity Cgd is increased delay in signal propagation, such as in scanning signals in the scanning signal lines and data signals in the data signal lines. These delays also decrease quality of display. Further, increased parasitic capacity per pixel leads to increased power consumption in the drive circuit of the active matrix substrate. Further, formation of a TFT for each subpixel and formation of a new capacity for each pixel require complicated mask patterns in the manufacture of the active matrix substrate, and can decrease production yield of the active matrix substrate.

According to the active matrix substrate included in the liquid crystal display panel disclosed in Patent Document 4, color arrangement is limited to the delta arrangement. Further, since the TFT's channel region is formed by means of self-alignment, a special manufacturing process which is different from common process is required.

Then, according to the TFT substrate serving as an active matrix substrate disclosed in Patent Document 5, an arrangement which provides improved patterning for TFT formation decreases parasitic capacity, and thereby decreases parasitic capacity inconsistency caused by pattern misalignment. However, the decrease in parasitic capacity inconsistency achievable by such an improvement alone is not sufficiently more significant than the levels achieved by the other conventional techniques described above, and so it is not possible to provide a satisfactory solution to the problems of block segmentation and annoying levels of flickering.

SUMMARY OF THE INVENTION

In order to overcome the problems described above, preferred embodiments of the present invention provide an active matrix substrate capable of decreasing block segmentation and flickering due to separate exposure while avoiding decreased aperture ratio, increased parasitic capacity and complication in the manufacturing process, and provide a display device including such an active matrix substrate.

A first preferred embodiment of the present invention provides an active matrix substrate which includes:
  a plurality of data signal lines;
  a plurality of scanning signal lines intersecting with the data signal lines; and
  a pixel array including a plurality of pixel circuits disposed in a matrix pattern correspondingly to the respective intersections made by the data signal lines and the scanning signal lines.
Each pixel circuit includes:
  a field-effect transistor having a source electrode connected, directly or via a predetermined element, with the data signal line which passes through a corresponding one of the intersections, and a gate electrode connected with the scanning signal line which passes through the corresponding intersection; and
  a voltage holding electrode connected, directly or via a predetermined element, with a drain electrode of the field-effect transistor and constituting a voltage holding capacitor.
The pixel circuits in the pixel array are provided by:
  a number of those pixel circuits whose field-effect transistor is provided by a first-type field-effect transistor which gives an increasingly large electrostatic capacitance between the drain electrode and the gate electrode in accordance with an increase in a positional shift between a pattern for the drain electrode and a pattern for the gate electrode in a predetermined direction; and
  a substantially same number of those pixel circuits whose field-effect transistor is provided by a second-type field-effect transistor which gives an increasingly small electrostatic capacitance between the two electrodes in accordance with the increase in the positional shift in the predetermined direction.
Further, the pixel circuits including the first-type field-effect transistor and the pixel circuits including the second-type field-effect transistor are disposed in substantially uniform dispersion in the pixel array.

A second preferred embodiment of the present invention provides the active matrix substrate according to the first preferred embodiment of the present invention, wherein:
  the first-type field-effect transistor has an increasingly large area of overlap between the gate electrode and the drain electrode via a predetermined insulation layer, in accordance with an increase in the positional shift in the predetermined direction in the first-type field-effect transistor, and
  the second-type field-effect transistor has an increasingly small area of overlap between the gate electrode and the drain electrode via a predetermined insulation layer, in accordance with the increase in the positional shift in the predetermined direction in the second-type field-effect transistor.

A third preferred embodiment of the present invention provides the active matrix substrate according to the first preferred embodiment of the present invention, wherein:
  the area of overlap between the gate electrode and the drain electrode via the predetermined insulation layer in the first-type and the second-type field-effect transistors is not changed by a positional shift in a direction perpendicular to the predetermined direction.

A fourth preferred embodiment of the present invention provides the active matrix substrate according to the first preferred embodiment of the present invention, wherein:
  the pixel circuit including the first-type field-effect transistor and the pixel circuit including the second-type field-effect transistor are disposed in alternation to each other by a predetermined quantity in a direction where the data signal lines extend, and in alternation to each other by a predetermined quantity in a direction where the scanning signal lines extend, in the pixel array.

A fifth preferred embodiment of the present invention provides the active matrix substrate according to the fourth preferred embodiment of the present invention, wherein:
  the pixel circuit including the first-type field-effect transistor and the pixel circuit including the second-type field-effect transistor are disposed in alternation to each other by a quantity of one in the direction where the data signal lines extend and in the direction where the scanning signal lines extend, in the pixel array.

A sixth preferred embodiment of the present invention provides the active matrix substrate according to the fourth preferred embodiment of the present invention:
  the pixel circuits including the first-type field-effect transistor and the pixel circuit including the second-type field-effect transistor are disposed in alternation to each other by a quantity of one in the direction where the data signal lines extend, and by a quantity of two in the direction where the scanning signal lines extend, in the pixel array.

A seventh preferred embodiment of the present invention provides the active matrix substrate according to the fourth preferred embodiment of the present invention, wherein:
  the pixel circuit including the first-type field-effect transistor and the pixel circuit including the second-type field-effect transistor are disposed in alternation to each other by a quantity of two in the direction where the data signal lines extend, and by a quantity of one in the direction where the scanning signal lines extend, in the pixel array.

An eighth preferred embodiment of the present invention provides an active matrix substrate which includes:
  a plurality of data signal lines;
  a plurality of scanning signal lines intersecting with the data signal lines; and a pixel array including a plurality of pixel circuit pairs disposed in a matrix pattern correspondingly to the respective intersections made by the data signal lines and the scanning signal lines.

With the above, each of the pixel circuit pairs includes two pixel circuits sandwiching the scanning signal line which passes through a corresponding one of the intersections.

Further, each of the two pixel circuits includes:

a field-effect transistor having a source electrode connected, directly or via a predetermined element, with the data signal line which passes through the corresponding intersection, and a gate electrode connected with the scanning signal line which passes through the corresponding intersection; and a voltage holding electrode connected, directly or via a predetermined element, with a drain electrode of the field-effect transistor and constituting a voltage holding capacitor; and further, one of the two pixel circuits is provided by a pixel circuit whose field-effect transistor is provided by a first-type field-effect transistor which gives an increasingly large electrostatic capacitance between the drain electrode and the gate electrode in accordance with an increase in a positional shift between a pattern for the drain electrode and a pattern for the gate electrode in a predetermined direction, and the other of the two pixel circuits is provided by a pixel circuit whose field-effect transistor is provided by a second-type field-effect transistor which gives an increasingly small electrostatic capacitance between the two electrodes in accordance with the increase in the positional shift in the predetermined direction.

A ninth preferred embodiment of the present invention provides the active matrix substrate according to one of the first through the eighth preferred embodiments of the present invention, in which the field-effect transistor is provided by a thin-film transistor.

A tenth preferred embodiment of the present invention provides a display device which includes a display panel having the active matrix substrate according to the ninth preferred embodiment of the present invention.

An eleventh preferred embodiment of the present invention provides a display device which includes a display panel having the active matrix substrate according to one of the first through the eighth preferred embodiments of the present invention.

A twelfth preferred embodiment of the present invention provides a display device which includes:

a liquid crystal display panel which includes the active matrix substrate according to the first or the second preferred embodiment of the present invention; and a drive circuit for driving the liquid crystal display panel in such a way that there is a dispersed distribution in the pixel array, of positive and negative polarities of the voltage held in the voltage holding capacitor in the pixel circuits in each frame of display included in the liquid crystal display panel.

Further, of these same-polarity pixel circuits whose voltage holding capacitors hold voltages of a same polarity in a given frame of display made in the liquid crystal display panel, those pixel circuits including the first-type field-effect transistor and those pixel circuits including the second-type field-effect transistor are disposed in substantially uniform dispersion in the pixel array.

A thirteenth preferred embodiment of the present invention provides a display device which includes:

a color liquid crystal display panel which includes the active matrix substrate according to one of the first through the eighth preferred embodiments of the present invention; and a drive circuit for driving the liquid crystal display panel in such a way that there is a dispersed distribution in the pixel array, of positive and negative polarities of the voltage held in the voltage holding capacitor in the pixel circuits in each frame of display made in the liquid crystal display panel.

Further, of these same-polarity pixel circuits whose voltage holding capacitors hold voltages of a same polarity in a given frame of display made in the liquid crystal display panel, those pixel circuits including the first-type field-effect transistor and those pixel circuits including the second-type field-effect transistor are disposed in substantially uniform dispersion in each pixel circuit group for formation of pixels which represent one of the three primary colors for color display.

According to the first preferred embodiment of the present invention, those pixel circuits which include the first-type field-effect transistor and those including the second-type field-effect transistor are disposed substantially in uniform dispersion in the pixel array. If there is a positional shift between the drain electrode pattern and the gate electrode pattern in a predetermined direction in the first-type and the second-type field-effect transistors, there is a corresponding increase/decrease in the electrostatic capacitance or a parasitic capacity Cgd between the drain electrode and the gate electrode, and this change in the parasitic capacity Cgd occurs in reverse ways in the two transistors. Therefore, in the manufacture of the active matrix substrate by using a separate exposure technique, even if the separate exposure leaves pattern misalignment of different direction and extent from one exposed region to another, and even if such a misalignment causes inconsistency in the parasitic capacity which is different from one exposed region to another, the inconsistency in the parasitic capacity Cgd is averaged in each of the regions. The arrangement also averages the level shift ΔVd in the pixel electric potential which occurs in response to a drop of the voltage applied to the gate electrode of the field-effect transistor in each pixel circuit when the voltage falls from the gate ON voltage (a voltage which turns on the transistor) to the gate OFF voltage (a voltage which turns off the transistor). As a result, the pixel array as a whole assumes an averaged state which is virtually equivalent to a state where there is no pattern misalignment. In this way, it is possible to reduce the problem of block segmentation and flickering due to separate exposure, in display devices and sensors which use an active matrix substrate, by averaging the parasitic capacity Cgd based on an arrangement that the first-type and the second-type field-effect transistors are disposed in uniform dispersion in the pixel array. Moreover, since there is no need for additional constituent elements such as an additional TFT to each pixel circuit or addition of a capacity to compensate for the inconsistency in the parasitic capacity, there is no increase in the area that blocks light within each pixel formation portion. Therefore, there is no decrease in the aperture ratio unlike in the prior art described earlier. Also, since there is no need for additional constituent elements in each pixel circuit, there is no increase in the level of complication in the manufacturing process of the active matrix substrate, or no decrease, either, in terms of yield resulting from the complication. Further, since there is no increase in the parasitic capacity per pixel, there is no increase in the level shift ΔVd in the pixel electric potential which would decrease display quality. There is no increase, either, in propagation delay of the scanning signals, etc. or in power consumption by the drive circuit.

According to the second preferred embodiment of the present invention, the first-type and the second-type field-effect transistors which are disposed substantially in uniform dispersion in the pixel array are in a specific relationship, i.e. a positional shift between the drain electrode pattern and the gate electrode pattern in a predetermined direction will increase/decrease the area of overlap between the drain electrode and the gate electrode in reverse ways in the two transistors. With this arrangement, the pattern misalignment causes the gate-drain parasitic capacity Cgd to change in such a way that an increase/decrease in the parasitic capacity Cgd takes place in reverse ways in the first-type and the second-type field-effect transistors, providing the advantages as offered by the first preferred embodiment of the present invention.

According to the third preferred embodiment of the present invention, the first-type and the second-type field-effect transistors are in a relationship where a positional shift between the drain electrode pattern and the gate electrode pattern in a direction perpendicular to the predetermined direction does not change the area of overlap between the drain electrode and the gate electrode. With this arrangement, pattern misalignment in any direction causes the gate-drain parasitic capacity Cgd to change in reverse ways or not to change at all in the first-type and the second-type field-effect transistors, providing the advantages as offered by the first preferred embodiment of the present invention.

According to the fourth preferred embodiment of the present invention, the pixel circuit including the first-type field-effect transistor and the pixel circuit including the second-type field-effect transistor are disposed in alternation to each other by a predetermined quantity in a direction where the data signal lines extend, and in alternation to each other by a predetermined quantity in a direction where the scanning signal lines extend, in the pixel array. This accomplishes a substantially uniform dispersion, providing the advantages as offered by the first preferred embodiment of the present invention.

According to the fifth preferred embodiment of the present invention, the pixel circuit including the first-type field-effect transistor and the pixel circuit including the second-type field-effect transistor are disposed in alternation to each other by a quantity of one in the direction where the data signal lines extend, and in the direction where the scanning signal lines extend, in the pixel array. This accomplishes a substantially uniform dispersion, and provides the advantages as offered by the first preferred embodiment of the present invention. Further, in a case where the active matrix substrate according to a preferred embodiment of the present invention is used in a liquid crystal display device driven by line inversion drive method, the arrangement provides: of those same-polarity pixel circuits whose voltage holding capacitors hold voltages of the same polarity in a given frame of display made in the liquid crystal display panel, those pixel circuits including the first-type field-effect transistor and those pixel circuits including the second-type field-effect transistor are disposed in substantially uniform dispersion in the pixel array. Therefore, the fifth preferred embodiment of the present invention is effective in reducing block segmentation and flickering in liquid crystal display devices which use line inversion drive method.

According to the sixth preferred embodiment of the present invention, the pixel circuit including the first-type field-effect transistor and the pixel circuit including the second-type field-effect transistor are disposed in alternation to each other by a quantity of one in the direction where the data signal lines extend, and by a quantity of two in the direction where the scanning signal lines extend, in the pixel array. This accomplishes a substantially uniform dispersion, and provides the advantages as offered by the first preferred embodiment of the present invention. Further, in a case where the active matrix substrate according to a preferred embodiment of the present invention is used in a liquid crystal display device driven by dot inversion drive method (including both of 1H dot inversion drive method and 2H dot inversion drive method), the arrangement provides: of those same-polarity pixel circuits whose voltage holding capacitors hold voltages of the same polarity in a given frame of display made in the liquid crystal display panel, those pixel circuits including the first-type field-effect transistor and those pixel circuits including the second-type field-effect transistor are disposed in substantially uniform dispersion in the pixel array. Therefore, the sixth preferred embodiment of the present invention is effective in reducing block segmentation and flickering in liquid crystal display devices which use dot inversion drive method.

According to the preferred embodiment aspect of the present invention, the pixel circuits including the first-type field-effect transistor and the pixel circuit including the second-type field-effect transistor are disposed in alternation to each other by a quantity of two in the direction where the data signal lines extend, and by a quantity of one in the direction where the scanning signal lines extend, in the pixel array. This accomplishes a substantially uniform dispersion, and provides the advantages as offered by the first preferred embodiment of the present invention. Further, in a case where a liquid crystal display device uses an active matrix substrate where two pixel circuits in proximity to each other in the horizontal direction are driven by the same signal (hereinafter called "one-signal-drives-two-pixels method"), and the liquid crystal display device is driven by line inversion drive method or dot inversion drive method, the arrangement provides: of those same-polarity pixel circuits whose voltage holding capacitors hold voltages of the same polarity in a given frame of display made in the liquid crystal display panel, those pixel circuits including the first-type field-effect transistor and those pixel circuits including the second-type field-effect transistor are disposed in substantially uniform dispersion in the pixel array. Therefore, the seventh preferred embodiment of the present invention is effective in reducing block segmentation and flickering in liquid crystal display device which use one-signal-drives-two-pixels method.

Further, for the same reason, the seventh preferred embodiment of the present invention is effective in liquid crystal display devices which use line inversion drive method, regardless of whether the active matrix substrate is of the one-signal-drives-two-pixels method.

According to the eighth preferred embodiment of the present invention, an active matrix substrate includes a pixel array having a plurality of pixel circuit pairs disposed in a matrix pattern, and each of the pixel circuit pairs is constituted by two pixel circuits sandwiching the scanning signal line which passes the corresponding intersection (as will be described, this structure is called "center-gate structure"). With the above, one of the two pixel circuits constituting each pair includes the first-type field-effect transistor whereas the other includes the second-type field-effect transistor. This accomplishes a substantially uniform dispersion of the pixel circuits including the first-type field-effect transistor and the pixel circuits including the second-type field-effect transistor, providing the advantages as offered by the first preferred embodiment of the present invention.

According to the ninth preferred embodiment of the present invention which provides an active matrix substrate where the field-effect transistor in each pixel circuit is provided by a thin-film transistor, the same advantages are provided as offered by the first preferred embodiment of the present invention.

According to the tenth preferred embodiment of the present invention which provides a display device including the active matrix substrate, the same advantages are provided as offered by the ninth preferred embodiment of the present invention.

According to the eleventh preferred embodiment of the present invention which provides a display device including the active matrix substrate, the same advantages are provided as offered by the first through the eighth preferred embodiments of the present invention.

According to the twelfth preferred embodiment of the present invention, of those same-polarity pixel circuits whose voltage holding capacitors hold voltages of the same polarity in a given frame of display made in the liquid crystal display panel, those pixel circuits including the first-type field-effect transistor and those pixel circuits including the second-type field-effect transistor are disposed in substantially uniform dispersion in the pixel array. Therefore, the arrangement provides the same advantages as offered by the first preferred embodiment of the present invention, and enables to reduce block segmentation and flickering in the display device which includes a drive circuit for driving the liquid crystal display panel in such a way that there is a dispersed distribution in the pixel array, of a positive and a negative polarities of the voltage held in the voltage holding capacitor in the pixel circuits in each frame.

According to the thirteenth preferred embodiment of the present invention which includes a color, liquid crystal display panel, of those same-polarity pixel circuits whose voltage holding capacitors hold voltages of the same polarity in a given frame of display made in the liquid crystal display panel, those pixel circuits including the first-type field-effect transistor and those pixel circuits including the second-type field-effect transistor are disposed in substantially uniform dispersion in each pixel circuit group for formation of pixels which represent one of the three primary colors for color display. Therefore, the arrangement provides the same advantages as offered by the first preferred embodiment of the present invention and enables to reduce block segmentation and flickering even when any of the three primary colors is displayed in the entire screen, in the display device which includes the drive circuit for driving the liquid crystal display panel in such a way that there is a dispersed distribution in the pixel array, of a positive and a negative polarities of the voltage held in the voltage holding capacitor in the pixel circuits in each frame.

These and additional elements, features, characteristics, advantages and strengths of the present invention will be made clear by the description of preferred embodiments thereof below. Further, the advantages of preferred embodiments of the present invention will be evident from the following explanation in reference to the drawings.

BRIEF DESCRIPTION OF THE DRAWINGS

FIG. 9A is a fragmentary plan view which shows a construction of the active matrix substrate according to the second preferred embodiment, FIG. 9B is an enlarged plan view which shows a construction of a first-type TFT in the active matrix substrate, and FIG. 9C is an enlarged plan view which shows a construction of a second-type TFT in the active matrix substrate.

FIG. 11A is a fragmentary plan view which shows a construction of an active matrix substrate according to a third preferred embodiment of the present invention, FIG. 11B is an enlarged plan view which shows a construction of a first-type TFT in the active matrix substrate, and FIG. 11C is an enlarged plan view which shows a construction of a second-type TFT in the active matrix substrate.

FIG. 12A is a fragmentary plan view which shows a construction of an active matrix substrate according to a fourth preferred embodiment of the present invention, FIG. 12B is an enlarged plan view which shows a construction of a first-type TFT in the active matrix substrate, and FIG. 12C is an enlarged plan view which shows a construction of a second-type TFT in the active matrix substrate.

FIGS. 17A-17E are plan views which show various kinds of TFTs which are usable when applying the present invention to an active matrix substrate of a center-gate structure.

FIG. 18A is a conceptual diagram which shows a preferred TFT layout pattern for a line inversion drive method in a liquid crystal display device which makes use of an active matrix substrate of a construction according to one of the first through the fourth preferred embodiments; FIG. 18B is a conceptual diagram which shows a preferred TFT layout pattern for 1H dot inversion drive method in the liquid crystal display device; and FIG. 18C is a conceptual diagram which shows a preferred TFT layout pattern for 2H dot inversion drive method in the liquid crystal display device.

FIG. 19A is a waveform chart of a scanning signal in a liquid crystal display device which makes use of an active matrix substrate of a construction according to one of the first through the fourth preferred embodiments; FIG. 19B is a timing chart which shows data signal polarities in a case where a line inversion drive method is used in the liquid crystal display device; FIG. 19C is a timing chart which shows data signal polarities in a case where a 1H dot inversion drive method is used in the liquid crystal display device; and FIG. 19D is a timing chart which shows data signal polarities in a case where a 2H dot inversion drive method is used in the liquid crystal display device.

FIG. 20A is a conceptual diagram which shows a preferred TFT layout pattern for a line inversion drive method in a liquid crystal display device which makes use of an active matrix substrate of a center-gate construction according to the variation; FIG. 20B is a conceptual diagram which shows a preferred TFT layout pattern for a 1H dot inversion drive method in the liquid crystal display device; and FIG. 20C is a conceptual diagram which shows a preferred TFT layout pattern for a 2H dot inversion drive method in the liquid crystal display device.

DETAILED DESCRIPTION OF PREFERRED EMBODIMENTS 1.1 Overall Configuration

Figure 1:
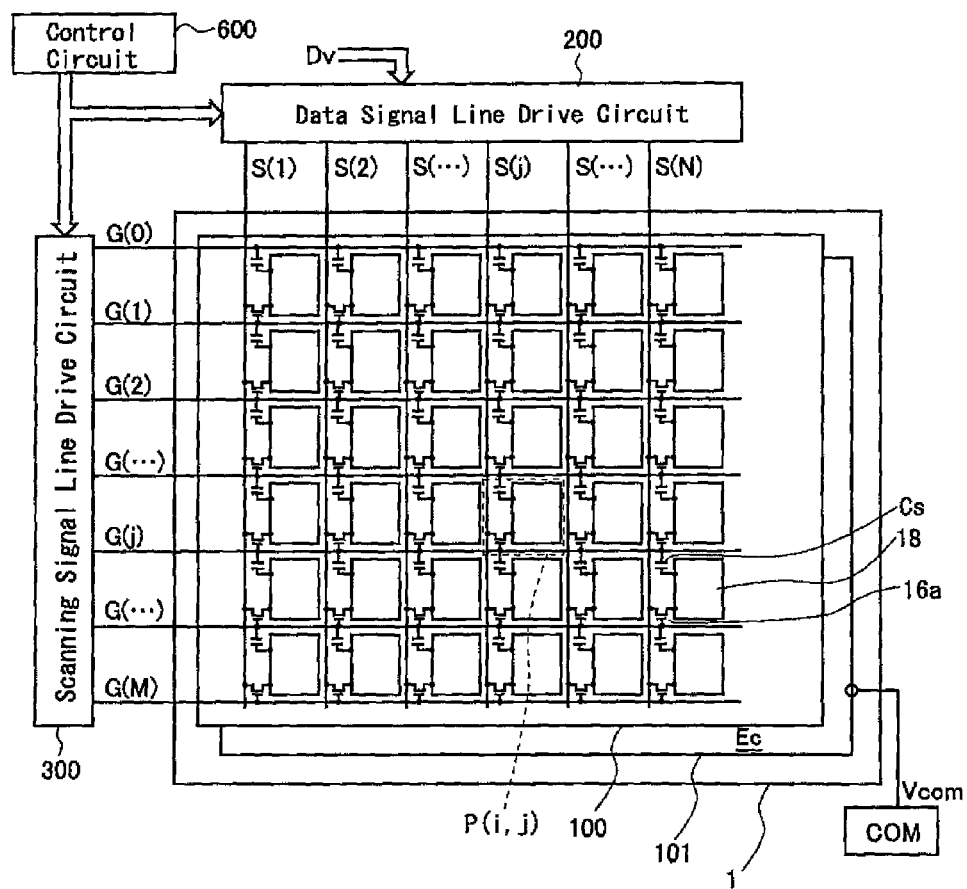
FIG. 1 is a block diagram which shows an overall configuration of a liquid crystal display device which makes use of a TFT substrate as an active matrix substrate according to a first preferred embodiment of the present invention.

FIG. 1 is a block diagram which shows an overall configuration of a liquid crystal display device including a TFT substrate that is an active matrix substrate according to a first preferred embodiment of the present invention. The liquid crystal display device includes: a liquid crystal display panel 1; a drive circuit that has a data signal line drive circuit 200, a scanning signal line drive circuit 300 and an opposed electrode drive circuit COM; and a control circuit 600.

The liquid crystal display panel 1 includes a pair of electrode substrates sandwiching a liquid crystal layer. Each of the electrode substrates has its outer surface provided with a polarizer plate. One of these electrode substrates is an active matrix substrate called TFT substrate. The TFT substrate 100 includes an insulating substrate provided by glass for example, on which a plurality of data signal lines S(1) through S(N) and a plurality of scanning signal lines G(1) through G(M) are formed in a grid pattern to intersect with each other. Also, a plurality (N times M) of pixel formation portions P(i, j), each corresponding to one of the intersections made by the data signal lines S(1) through S(N) and the scanning signal lines G(1) through G(M), are formed in a matrix pattern. These pixel formation portions P(i, j) correspond to pixels which form an image to be displayed. With the above, an alignment film is provided to cover these signal lines S(1) through S(N), G(1) through G(M) and the pixel formation portions P(i, j) almost over the entire surface. On the other hand, the other of the electrode substrates, which is called an opposed substrate 101, includes an insulating, transparent substrate provided by glass for example, on which an opposed electrode Ec and an alignment film are layered in this sequence on the entire surface. It should be noted here that in the present specification, the pixel formation portion will be called "pixel circuit" when the portion is described from a perspective of circuitry. Likewise, the term "pixel" means the smallest unit of an image formed by using an active matrix substrate, and the term "pixel formation portion" refers to a constituent element of the active matrix substrate for formation of a portion of the image represented as the smallest unit. Therefore, even if the constituent element for formation of an image portion representing the smallest unit includes two or more pixel electrodes or TFTs, the constituent element is a single pixel formation portion or a single pixel circuit. On the other hand, even if a constituent element represents the smallest unit of an image represented by image signals supplied from outside to the display device which uses the active matrix substrate, the element will be considered as a plurality of pixel formation portions if the element includes two or more pixel electrodes and pixel capacities corresponding thereto, and if these pixel capacities are supplied with different voltages from each other (correspondingly to area coverage modulation, for example). In cases of active matrix substrates for making color display, each of the three constituent elements representing R (red), G (green) and B (blue) respectively constitutes a pixel formation portion or a pixel circuit according to the above-described definition, although it is possible to consider these three elements as one element.

1.2 Construction of the TFT Substrate and TFTs

Next, description will cover construction of the TFT substrate 100 according to the present preferred embodiment and the TFTs included therein. It should be noted here that the TFT substrate 100 has a different pattern configuration for formation of each element, from those in conventional TFT substrates, but there is no special manufacturing steps or materials required, and the manufacture can be achieved in a conventional manner, so these details will not be covered here.

Figure 2:
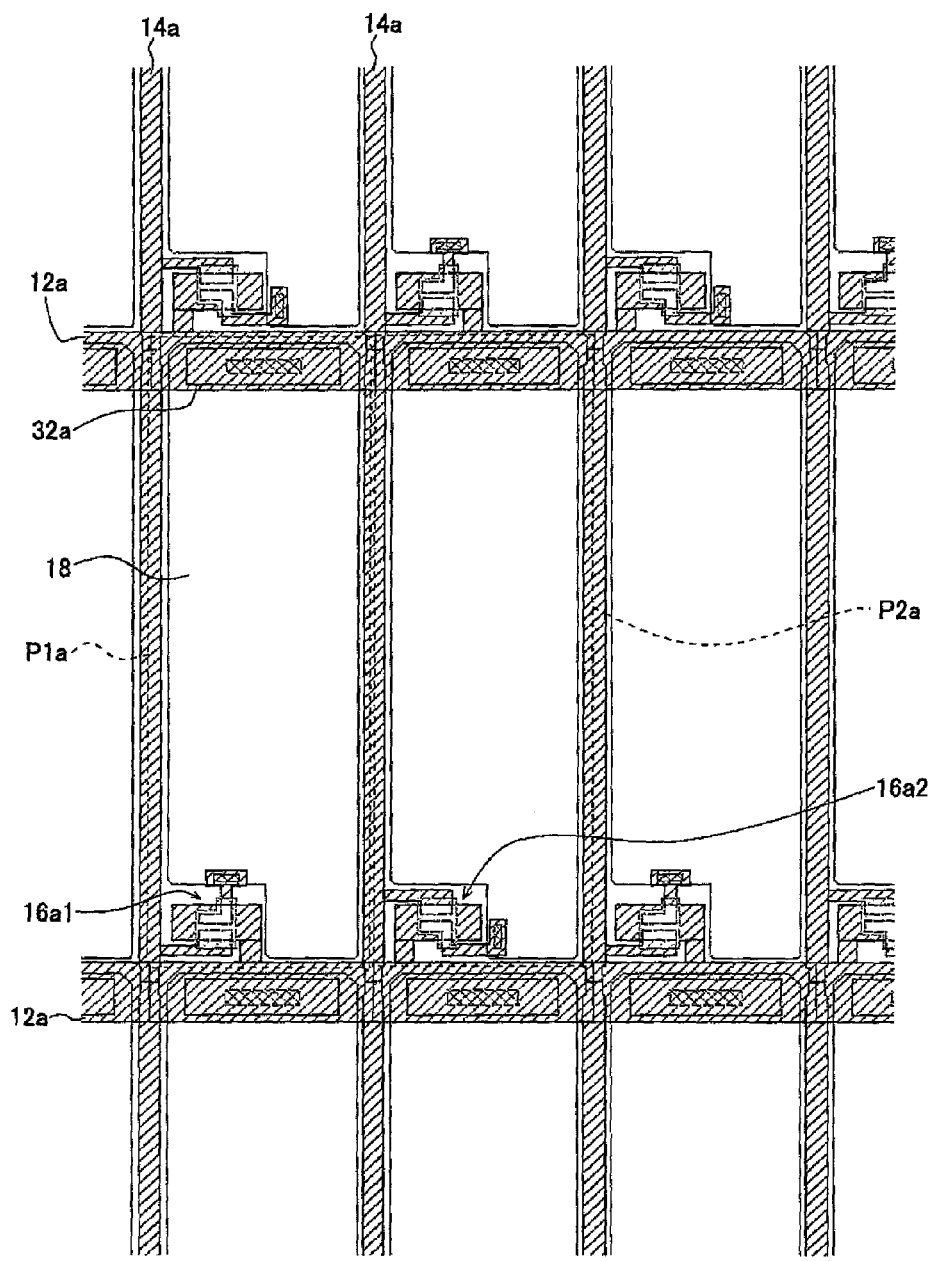
FIG. 2 is a fragmentary plan view which shows a construction of the active matrix substrate according to the first preferred embodiment of the present invention.

FIG. 2 is a fragmentary plan view which shows a construction of the TFT substrate 100 according to the present preferred embodiment. Each pixel circuit P(i, j) in the liquid crystal display device shown in FIG. 1 is implemented by a pixel formation portion P1a or P2a (surrounded by broken lines), which has a construction shown in FIG. 2 (i=1 through N, j=1 through M). Both of the pixel formation portions P1a and P2a include a TFT formed near an intersection made by gate wiring 12a which provides the scanning signal line G(j) and source wiring 14a which provides the data signal line S(i); however, a TFT 16a1 in the first pixel formation portion P1a differs from a TFT 16a2 in the second pixel formation portion P2a in terms of construction (Details to be described later). In the present preferred embodiment, each of the pixel formation portions P1a, P2a is provided with an auxiliary capacity electrode 32a in a manner to oppose to the adjacent gate wiring (which represents the scanning signal line G(j−1), i.e. gate wiring adjacent to the scanning signal line G(j) that passes the currently-mentioned pixel formation portion) 12a, via an insulation layer. The auxiliary capacity electrode 32a and the adjacent gate wiring 12a form an auxiliary capacity Cs.

Figure 3A:
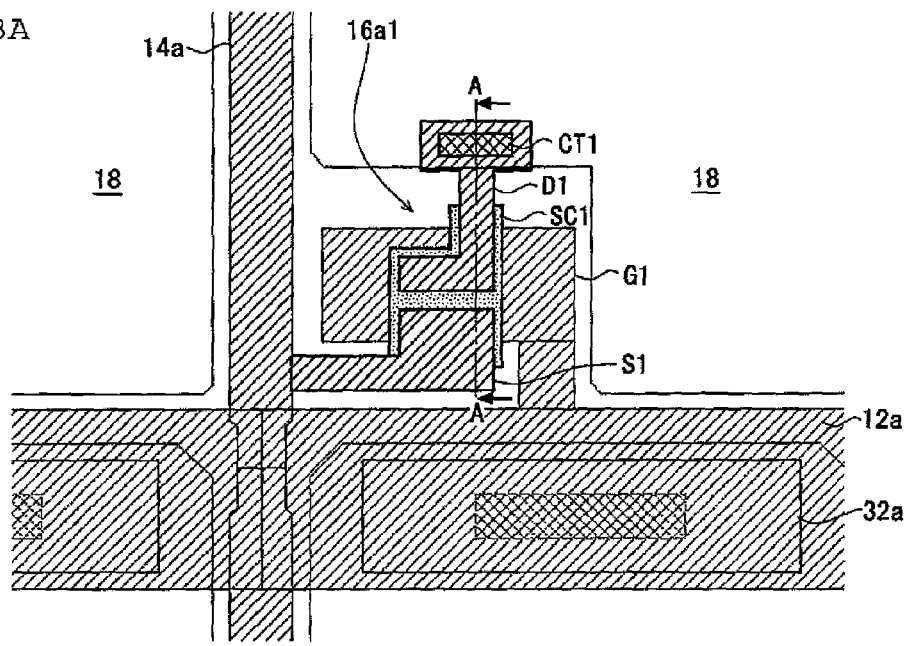
FIG. 3A is an enlarged plan view which shows a construction of a first-type TFT (thin-film transistor) in the active matrix substrate according to the first preferred embodiment.
Figure 3B:
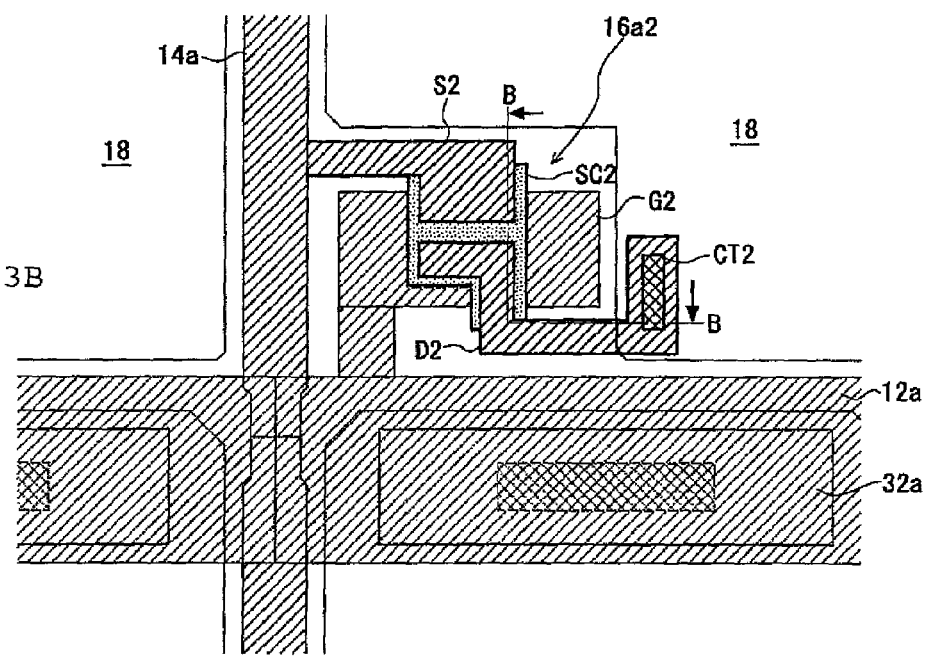
FIG. 3B is an enlarged plan view which shows a construction of a second-type TFT in the active matrix substrate.
Figure 4A:
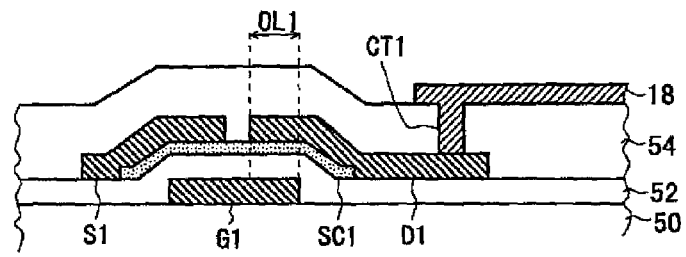
FIG. 4A is a sectional view taken along a line A-A in FIG. 3A.
Figure 4B:
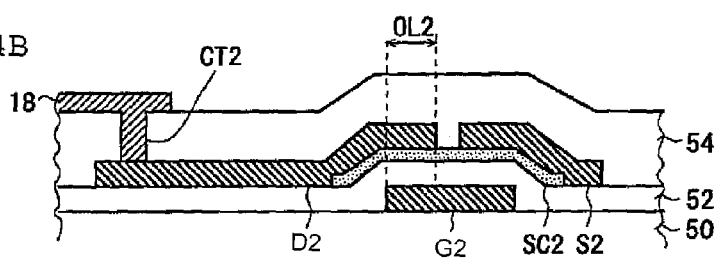
FIG. 4B is a sectional view taken along a line B-B in FIG. 3B.

FIG. 3A is an enlarged plan view which shows a construction of the first-type TFT 16a1 or the TFT in the first pixel formation portion P1a whereas FIG. 3B is an enlarged plan view which shows a construction of the second-type TFT 16a2 or the TFT in the second pixel formation portion P2a. FIG. 4A is a sectional view taken along a line A-A in FIG. 3A whereas FIG. 4B is a sectional view taken along a line B-B in FIG. 3A.

First, reference will be made to FIG. 3A and FIG. 4A to describe a construction of the first-type TFT 16a1 in the first pixel formation portion P1a. The first-type TFT 16a1 has a gate electrode G1 which is formed on an insulating, transparent substrate 50, as a pattern branching from the gate wiring 12a that extends in the Row direction. A gate insulation layer 52 is formed to cover the gate electrode G1, and a semiconductor layer SC1 is formed to cover a predetermined portion of the gate electrode G1 via the gate insulation layer 52. The semiconductor layer SC1 is provided by e.g. amorphous silicon doped with n-type impurity. A source electrode S1 of the TFT 16a1 is formed to overlap the semiconductor layer SC1, as a pattern branched from the source wiring 14a. Further, a drain electrode D1 of the TFT 16a1 is formed to oppose to the source electrode S1 at a predetermined space (which defines a channel length of the TFT 16a1) as well as to overlap the semiconductor layer SC1. The source electrode S1 and the drain electrode D1 are then covered by a protective film 54 formed thereon. The first pixel formation portion P1a includes a pixel electrode 18 which is formed by layering an electrically conductive, transparent material such as ITO (Indium Tin Oxide) on the protective film 54, and is electrically connected with the drain electrode D1 via a contact CT1 opened in the protective film 54.

Each of the constituent elements which constitute the first-type TFT 16a1, i.e. the gate electrode G1, the source electrode S1, the drain electrode D1, the semiconductor layer SC1, etc. is given their form through a layering process by means of, e.g., plasma CVD (Chemical Vapor Deposition) method and patterning by means of photolithography. Pattern misalignment in this particular production process leaves inconsistency in terms of the area of overlapping between the gate electrode G1 and the drain electrode D1 (the area of a region indicated by "OL1" in FIG. 4A), and this inconsistency causes inconsistency (increase/decrease) in the value of parasitic capacity Cgd between the gate and the drain. Particularly in cases of manufacturing a large TFT substrate where separate exposure is a common practice, there is a high likelihood that those segmented regions resulting from the separate exposure will have inconsistency or difference from one segmented region from another. Such inconsistency will cause display problems described earlier, i.e. block segmentation and flickering in display devices that use the TFT substrate. It should be noted here that in the present preferred embodiment, increase/decrease in the parasitic capacity Cgd caused by pattern misalignment is reduced by an arrangement as shown in FIG. 3A, where the drain electrode D1 has a narrower portion which passes an edge of the gate electrode G1, than the source electrode S1. (The same arrangement is used in the second-type TFT 16a2 to be described next.)

Next, reference will be made to FIG. 3B and FIG. 4B to describe a construction of the second-type TFT 16a2 in the second pixel formation portion P2a. The second-type TFT 16a2 also has a gate electrode G2 which is formed on an insulating, transparent substrate 50, as a pattern branching from the gate wiring 12a that extends in the Row direction. (However, branching of the gate electrode G2 is made at a place slightly different from the case in the first-type TFT 16a1.) Then, similarly to the first-type TFT 16a1, a gate insulation layer 52 is formed to cover the gate electrode G2, and a semiconductor layer SC2 is formed to cover a predetermined portion of the gate electrode G2 via the gate insulation layer 52. A source electrode S2 of the TFT 16a2 is formed to overlap the semiconductor layer SC2, as a pattern branched from the source wiring 14a. Further, a drain electrode D2 of the TFT 16a2 is formed to oppose to the source electrode S2 at a predetermined space (which defines a channel length of the TFT 16a2) as well as to overlap the semiconductor layer SC2. Now, as will be clear from comparison between FIG. 3B and FIG. 3A, the positional relationship between the gate electrode G2 and the drain electrode D2 in the second-type TFT 16a2 is a reverse relationship of the relationship between the gate electrode G1 and the drain electrode D1 in the first-type TFT 16a1. Specifically, in the first-type TFT 16a1, the drain electrode D1 is located on the upper side (as in FIG. 3A) of the gate electrode G1 while overlapping the gate electrode G1, whereas in the second-type TFT 16a2, the drain electrode D2 is located on the lower side (as in FIG. 3B) of the gate electrode G2 while overlapping the gate electrode G2. The drain electrode D2 and the source electrode S2 are formed in such a layout pattern, and then the protective film 54 is formed. The second pixel formation portion P2a also includes a pixel electrode 18 which is formed in the same way, i.e. by layering an electrically conductive, transparent material such as ITO (Indium Tin Oxide) on the protective film 54, and is electrically connected with the drain electrode D2 via a contact CT2 opened in the protective film 54.

In the second-type TFT 16a, too, pattern misalignment in the production process leaves inconsistency in terms of the area of overlapping between the gate electrode G2 and the drain electrode D2 (the area of a region indicated by "OL2" in FIG. 4B), and this inconsistency causes inconsistency (increase/decrease) in the value of parasitic capacity Cgd between the gate and the drain. However, in the second-type TFT 16a2, the drain electrode D2 is on the lower side of the gate electrode G2, and the positional relationship between drain electrode D2 and gate electrode G2 is a reversed relationship of the positional relationship between drain electrode D1 and gate electrode G1 in the first-type TFT 16a1 (FIG. 3A). Therefore, increase/decrease in the value of gate-drain parasitic capacity Cgd caused by the pattern misalignment takes a reversed pattern of the pattern in the first-type TFT 16a1. Specifically, take a case where a formation pattern for the drain electrodes D1, D2 is misaligned or shifted upward (as in FIGS. 3A, 3B) with respect to a formation pattern for the gate electrodes G1, G2. The first-type TFT 16a1 will have a reduced area of overlap between the gate electrode G1 and the drain electrode D1 and therefore will have a decrease in the parasitic capacity Cgd whereas the second-type TFT 16a2 will have an increased area of overlap between the gate electrode G2 and the drain electrode D2 and therefore will have an increase in the parasitic capacity Cgd. (It should be noted that if the pattern misalignment is in a direction perpendicular to the up-down direction, i.e. is in the right-left direction, and not greater than a certain tolerable amount, the misalignment will not change the parasitic capacity Cgd.)

According to the present preferred embodiment, as shown in FIG. 2, a matrix of M-times-N pixel circuits P(i, j) (hereinafter called "pixel array") includes two kinds of TFTs, i.e. the first-type TFT 16a1 and the second-type TFT 16a2 as described above, substantially in the same number, and these two kinds are disposed in uniform dispersion in the pixel array. Specifically, the first pixel formation portion P1a and the second pixel formation portion P2a respectively including the first-type TFT 16a1 and the second-type TFT 16a2 as described above are disposed alternately to each other in the Row direction (the direction in which gate wiring 12a extends) and in the Column direction (the direction in which source wiring 14a extends).

1.3 Pixel Circuit

Figure 5:
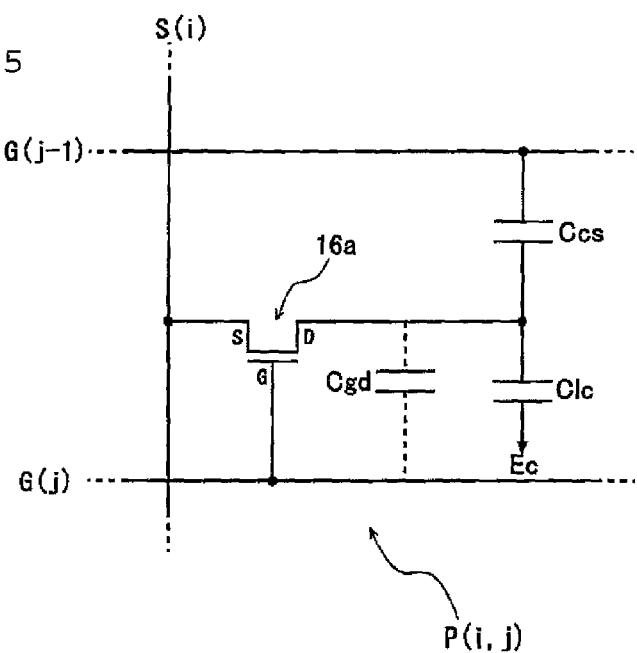
FIG. 5 is a circuit diagram of a pixel circuit (an equivalent circuit of a pixel formation portion) in the active matrix substrate according to the first preferred embodiment of the present invention.
Figure 22:
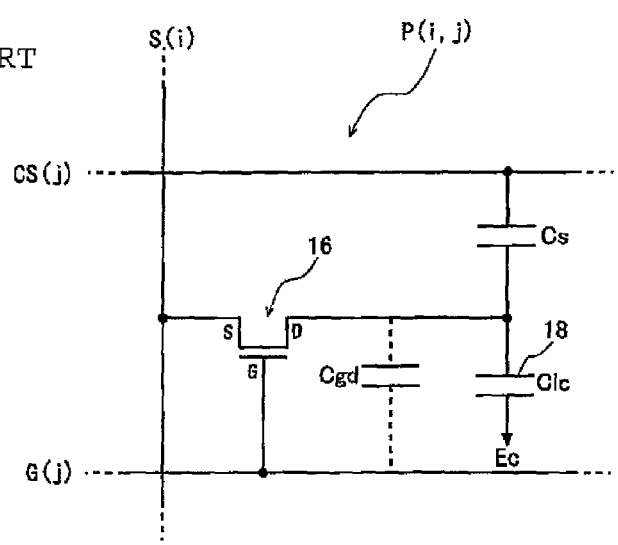
FIG. 22 is a circuit diagram of a pixel circuit in a conventional active matrix substrate used in a liquid crystal display device.
Figure 23:
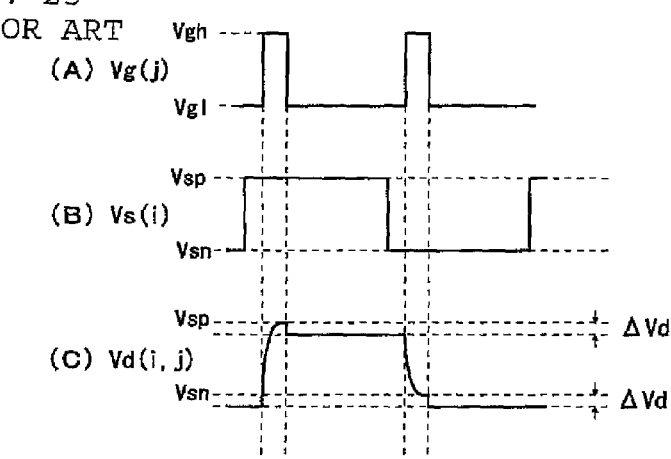
FIGS. 23A-23C are simple voltage waveform charts of signals and pixel electric potentials for driving the conventional active matrix substrate.

In terms of circuitry, the first pixel formation portion P1a which includes the first-type TFT 16a1 and the second pixel formation portion P2a which includes the second-type TFT 16a2 are of the same configuration. FIG. 5 shows the configuration of the pixel circuit P(i, j) which is equivalent to each of the pixel formation portion P1a and P2a. The pixel circuit P(i, j) includes: a TFT 16a which represents the first or the second-type TFT 16a1, 16a2; a liquid crystal capacity Clc formed by the pixel electrode 18 and the opposed electrode Ec faced thereto via the liquid crystal layer; an auxiliary capacity Cs formed by the auxiliary capacity electrode 32a and the adjacent gate wiring 12a which represents the scanning signal line G(j−1); and a gate-drain parasitic capacity Cgd formed by the gate electrode G1 or G2 and the drain electrode D1 or D2 which represent the gate terminal and the drain terminal respectively of the TFT 16a. The TFT 16a has its gate terminal (gate electrode), source terminal (source electrode) and drain terminal (drain electrode) connected with the scanning signal line G(j), the data signal line S(i) and the pixel electrode 18, respectively. Thus, the drain terminal of the TFT 16a is connected with the opposed electrode Ec via the liquid crystal capacity Clc, as well as with the scanning signal line G(j−1) via the auxiliary capacity Cs. With this arrangement, the pixel circuit P(i, j) according to the present preferred embodiment has the same configuration as the pixel circuit in FIG. 22 to which reference was made when describing the background art of the present invention. Therefore, as illustrated in FIG. 23A through FIG. 23C, the pixel circuit P(i, j) in the present preferred embodiment, too, will see a level shift ΔVd in the potential (pixel electric potential) Vd of the pixel electrode 18, due to the parasitic capacity Cgd, when the voltage Vg(j) of the scanning signal line G(j) falls from a gate ON voltage Vgh to a gate OFF voltage Vgl, and the level shift ΔVd is given by the following mathematical expression:

$$\Delta Vd = (Vgh - Vgl) \cdot Cgd/(Clc + Cs + Cgd) \tag{2}$$

1.4 Function and Advantages

Figures 6, 7:
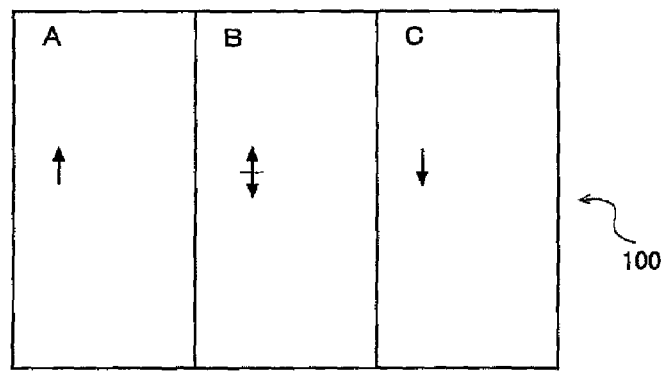
FIG. 6 is a diagram for describing pattern misalignment resulting from separate exposure when making an active matrix substrate.
FIG. 7 is a diagram for describing how block segmentation is reduced in the active matrix substrate according to the first preferred embodiment of the present invention.

Now, assume that there is a pattern misalignment as shown in FIG. 6, resulting from a process of separate exposure during manufacture of a TFT substrate 100 as an active matrix substrate according to the above-described preferred embodiment. Specifically, the TFT substrate 100 is divided into three regions correspondingly for the purpose of the separate exposure, i.e. a region A, a region B and a region C as shown in FIG. 6. The direction and extent of the pattern misalignment differ from one region to another. FIG. 6 provides following examples. In the region A, the pattern of the drain electrodes D1, D2 is shifted upward with respect to the pattern of the gate electrodes G1, G2 in each pixel formation portion (each pixel circuit P(i, j)); in the region B, the pattern of the drain electrode D1, D2 does not have a shift (or the shift is negligible) with respect to the pattern of gate electrodes G1, G2; and in the region C, the pattern of the drain electrodes D1, D2 is shifted downward with respect to the pattern of the gate electrodes G1, G2. In this case, as shown in FIG. 7, the parasitic capacity Cgd in the first-type TFT 16a1 is smaller in the region A, the same in the region B, and greater in the region C, than in the case where there is no pattern misalignment. On the contrary, the parasitic capacity Cgd in the second-type TFT 16a2 is greater in the region A, the same in the region B, and smaller in the region C, than in the case where there is no pattern misalignment. With the mathematical expression (2) given above, the level shift ΔVd (absolute value) of the pixel electric potential in each pixel circuit P(i, j) increases as the parasitic capacity Cgd increases, while the level shift ΔVd (absolute value) of the pixel electric potential decreases as the parasitic capacity Cgd decreases.

Now, the pixel array (a matrix of M-times-N pixel formation portions) in the TFT substrate 100 according to the present preferred embodiment includes, as shown in FIG. 2, two kinds of TFTs, i.e. the first-type TFT 16a1 and the second-type TFT 16a2 as described above, and they are disposed in uniform dispersion. Therefore, the region A has a uniform dispersion of the first pixel formation portions P1a which have a smaller level shift ΔVd (absolute value) of the pixel electric potential than in the case where there is no pattern misalignment, and the second pixel formation portions P2a which have a greater level shift ΔVd (absolute value) of the pixel electric potential than in the case where there is no pattern misalignment. In the region B, the level shift ΔVd of the pixel electric potential in any of the pixel formation portions is the same as in the case where there is no pattern misalignment, whereas the region C has a uniform dispersion of the first pixel formation portions P1a which have a greater level shift ΔVd (absolute value) of the pixel electric potential than in the case where there is no pattern misalignment, and the second pixel formation portions P2a which have a smaller level shift ΔVd (absolute value) of the pixel electric potential. As a result, in each of the region A, the region B and the region C, an average value of the level shift ΔVd (regional average value) is equal to a level shift ΔVd0, i.e. the value when there is no pattern misalignment. Hence, according to a liquid crystal display device which uses the TFT substrate 100, there is no tone difference amongst the regions when a display of a single tone is made over the entire display screen, nor is there a problem of flickering in particular segmented regions. In other words, according to the present preferred embodiment, problems such as block segmentation and flickering due to separate exposure performed in the manufacturing process are reduced by averaging of the parasitic capacities Cgd (and therefore averaging of the level shifts ΔVd) based on an arrangement that two kinds of TFTs 16a1 and 16a2 are disposed in uniform dispersion throughout the pixel array. It should be noted that pattern misalignment in a direction perpendicular to the up-down direction, i.e., in the right-left direction (and not greater than a certain tolerable amount) will not change the parasitic capacity Cgd. Hence, pattern misalignment in any direction will only result in mutually reversed patterns of increase/decrease in the parasitic capacity Cgd in the two types of TFTs, or in no change in the parasitic capacity Cgd. Thus, block segmentation and flickering resulting from pattern misalignment is reduced regardless of the direction of the misalignment.

Moreover, according to the present preferred embodiment, it is possible to reduce block segmentation and flickering only with the use of two kinds of TFTs as a TFT to be included in each pixel formation portion, without any need for additional TFTs or additional capacities to each pixel formation portion in order to compensate for parasitic capacity inconsistency. Since there is no need for additional constituent elements, there is no increase in the area that blocks light within the pixel formation portion. Therefore, there is no decrease in the aperture ratio unlike in the prior art described earlier. Also, since there is no need, as already said, for additional constituent elements in each pixel formation portion, there is no increase in the level of complication in the manufacturing process, or decrease in terms of yield, of the active matrix substrate (TFT substrate). Further, for the same reason, there is no increase in the parasitic capacity per pixel, and therefore there is no increase in the level shift $\Delta Vd$ in the pixel electric potential which would decrease display quality, nor is there increase in propagation delay of the scanning signals, etc., or in power consumption by the drive circuit.

Second Preferred Embodiment

Figure 8:
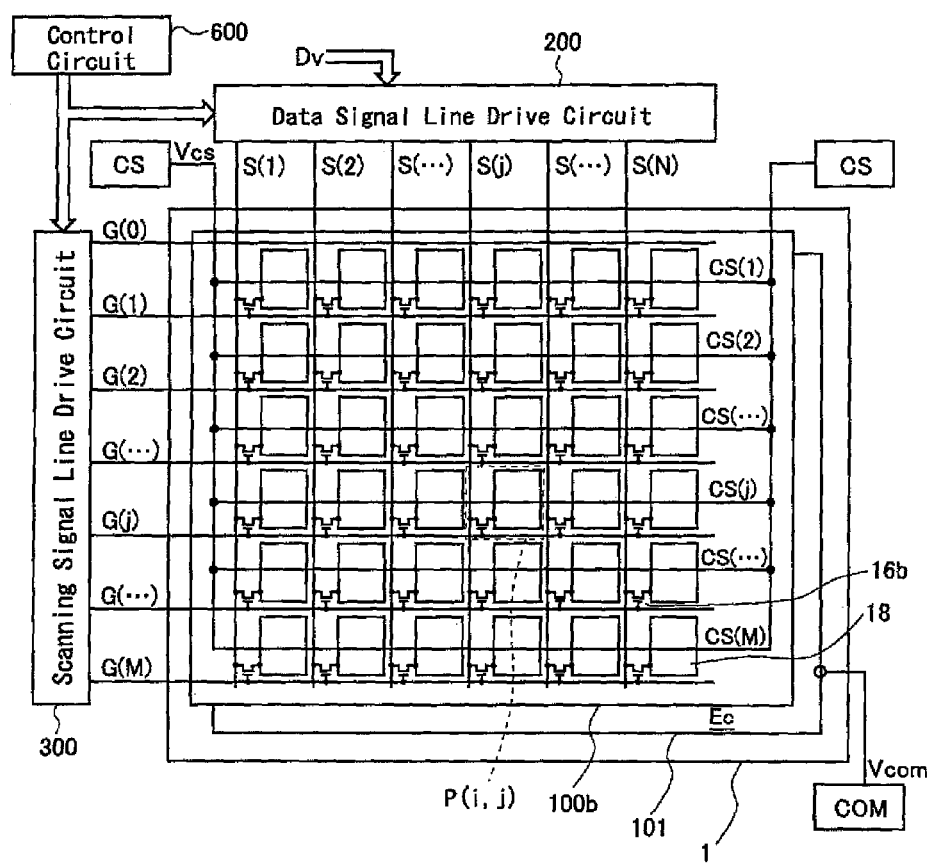
FIG. 8 is a block diagram which shows an overall configuration of a liquid crystal display device which makes use of a TFT substrate as an active matrix substrate according to a second preferred embodiment of the present invention.

FIG. 8 is a block diagram which shows an overall configuration of a liquid crystal display device including a TFT substrate which is an active matrix substrate according to a second preferred embodiment of the present invention. Differing from the first preferred embodiment, the liquid crystal display device includes: a plurality of auxiliary capacity lines CS(1) through CS(M) extending in parallel to respective scanning signal lines G(1) through G(M) formed on the TFT substrate 100b; and two auxiliary capacity line drive circuits CS for supplying a common electrode potential Vcs to each of the auxiliary capacity lines CS(1) through CS(M) from their first and second ends. All the other aspects of the configuration than these are identical with those of the liquid crystal display device (FIG. 1) which uses the TFT substrate 100 according to the first preferred embodiment; therefore, those identical or corresponding elements are indicated by the same reference symbols, and their detailed description will not be repeated. It should be noted here that the TFT substrate 100b has a different pattern configuration for formation of each element, from those in the first preferred embodiment, but manufacturing steps and materials required are the same as for the first preferred embodiment, so these details will not be covered here. (Same applies to other TFT substrates to be described as active matrix substrates according to other preferred embodiments to be described later.)

2.1 Construction of the TFT Substrate and TFTs

FIG. 9A is a fragmentary plan view which shows a construction of the TFT substrate 100b according to the present preferred embodiment. Each pixel circuit P(i,j) in the liquid crystal display device shown in FIG. 8 is implemented by a pixel formation portion P1b or P2b of a construction shown in FIG. 9A. Each of the pixel formation portions P1b and P2b include a TFT formed near an intersection made by gate wiring 12b which provides the scanning signal line G(j) and source wiring 14b which provides the data signal line S(i); however, a TFT 16b1 in the first pixel formation portion P1b differs from a TFT 16b2 in the second pixel formation portion P2b in terms of construction. (Details to be described later.) In the present preferred embodiment, each of the pixel formation portions P1b, P2b has a center region provided with an auxiliary capacity electrode 32b which is connected with the pixel electrode 18. Each auxiliary capacity electrode 32b is opposed to auxiliary capacity wiring 15b which provides the auxiliary capacity line CS(j), via the insulation layer, and thus, an auxiliary capacity Cs is formed by the auxiliary capacity electrode 32b and the auxiliary capacity wiring 15b in each of the pixel formation portions P1b, P2b.

FIG. 9B is an enlarged plan view which shows a construction of a first-type TFT 16b1 or the TFT in the first pixel formation portion P1b whereas FIG. 9C is an enlarged plan view which shows a construction of a second-type TFT 16b2 or the TFT in the second pixel formation portion P2b. Section structures of these TFTs 16b1, 16b2 are already clear from FIG. 4A and FIG. 4B which show section structures of the TFT 16a1, 16a2 according to the first preferred embodiment. Therefore, no more diagrams or description will be given here, nor in the other preferred embodiments to be described later.

As will be clear from comparison between FIG. 9B to FIG. 3A, the first-type TFT 16b1 according to the present preferred embodiment has the same construction (pattern configuration) as the first-type TFT 16a1 according to the first preferred embodiment; so identical or corresponding elements are indicated by the same reference symbols, and their detailed description will not be repeated. Likewise, as will be clear from comparison between FIG. 9C to FIG. 3B, the second-type TFT 16b2 according to the present preferred embodiment has the same construction (pattern configuration) as the second-type TFT 16a2 according to the first preferred embodiment; so again, identical or corresponding elements are indicated by the same reference symbols, and their detailed description will not be repeated.

As shown in FIG. 9B and FIG. 9C, according to the present preferred embodiment again, the drain electrode D1 in the first-type TFT 16b1 is located on the upper side (as in FIG. 9A) of the gate electrode G1 while overlapping the gate electrode G1, whereas in the second-type TFT 16b2, the drain electrode D2 is located on the lower side (as in FIG. 9C) of the gate electrode G2 while overlapping the gate electrode G2. Therefore, pattern misalignment in an up-down direction (as in FIGS. 9A and 9B) during the manufacturing process will cause increase/decrease in the parasitic capacity Cgd between the source and the drain in the TFTs 16b1, 16b2, as compared to the case where there is no pattern misalignment, and the increase/decrease in the parasitic capacity Cgd is of a reversed pattern between the first-type TFT 16b1 and the second-type TFT 16b2. (It should be noted here that pattern misalignment in a right-left direction and not greater than a certain tolerable amount will not change the parasitic capacity Cgd.) Specifically, if a formation pattern for the drain electrodes D1, D2 is shifted upward (as in FIGS. 9A-9C) with respect to a formation pattern for the gate electrodes G1, G2, the first-type TFT 16b1 will have a reduced area of overlap between the gate electrode G1 and the drain electrode D1, and therefore will have a decrease in the parasitic capacity Cgd whereas the second-type TFT 16b2 will have an increased area of overlap between the gate electrode G2 and the drain electrode D2, and therefore will have an increase in the parasitic capacity Cgd.

As shown in FIG. 9A, in the present preferred embodiment again, the pixel array which is a matrix of M-times-N pixel circuits P(i, j) includes two kinds of TFTs, i.e. the first-type TFT 16b1 and the second-type TFT 16b2 as described above, substantially in the same number, and these two kinds are disposed in uniform dispersion in the pixel array. Specifically, the first pixel formation portion P1b and the second pixel formation portion P2b respectively including the first-type TFT 16a1 and the second-type TFT 16a2 as described above are disposed alternately to each other in the Row direction (the direction in which the gate wiring 12*b* extends) and in the Column direction (the direction in which the source wiring 14*b* extends).

2.2 Pixel Circuit

Figure 10:
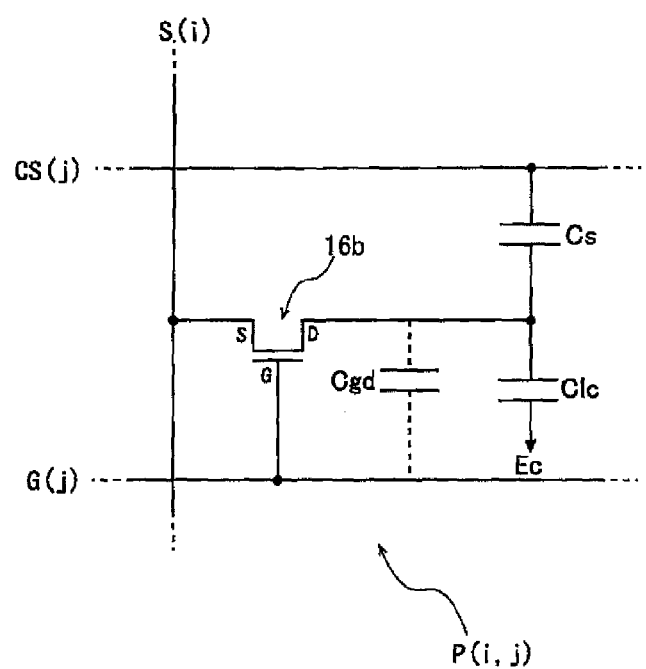
FIG. 10 is a circuit diagram of a pixel circuit in the active matrix substrate according to the second preferred embodiment of the present invention.

In terms of circuitry, the first pixel formation portion P1*b* which includes the first-type TFT 16*b*1 and the second pixel formation portion P2*b* which includes the second-type TFT 16*b*2 have the same configuration. FIG. 10 shows the configuration of the pixel circuit P(i,j) which is equivalent to the pixel formation portion P1*a* or P2*a*. Like in the first preferred embodiment, the pixel circuit P(i,j) includes: a TFT 16*b* which represents the first or the second-type TFT 16*b*1, 16*b*2; a liquid crystal capacity Clc; an auxiliary capacity Cs; and a gate-drain parasitic capacity Cgd. The present preferred embodiment differs from the first preferred embodiment, however, in that the auxiliary capacity Cs is formed by an auxiliary capacity electrode 32*b* and the auxiliary capacity wiring 15*b* which is provided by the auxiliary capacity lines CS(j), and the TFT 16*b* has its drain terminal (drain electrode) connected with the auxiliary capacity line CS (j) via the auxiliary capacity Cs. All the other aspects of the configuration are identical with those of the pixel circuit P(i, j) according to the first preferred embodiment (FIG. 5), and therefore will not be described here.

Again in the pixel circuit P(i, j) according to the present preferred embodiment, as illustrated in FIG. 23A through FIG. 23C, there is a level shift ΔVd in the potential (pixel electric potential) Vd of the pixel electrode 18 due to the parasitic capacity Cgd when the voltage Vg(j) of the scanning signal line G(j) falls from a gate ON voltage Vgh to a gate OFF voltage Vgl, and the level shift ΔVd is given by the following mathematical expression:

$$\Delta Vd = (Vgh - Vgl) \cdot Cgd / (Clc + Cs + Cgd) \quad (3)$$

2.3 Function and Advantages

Again, the pixel array in the TFT substrate 100*b* according to the present preferred embodiment includes, as shown in FIG. 9A and as in the first preferred embodiment, two kinds of TFTs, i.e. the first-type TFT 16*b*1 and the second-type TFT 16*b*2 as described above, and they are disposed in uniform dispersion. Therefore, problems such as block segmentation and flickering due to separate exposure performed in the manufacturing process are reduced by averaging of the parasitic capacities Cgd (and therefore averaging of the level shifts ΔVd) based on an arrangement that two kinds of TFTs 16*b*1 and 16*b*2 are disposed in uniform dispersion, and the same advantages are enjoyed as in the first preferred embodiment.

3. Third Preferred Embodiment

Next, description will be made for a liquid crystal display device including a TFT substrate as an active matrix substrate according to a third preferred embodiment of the present invention. The liquid crystal display device has an overall configuration which is essentially the same as the second preferred embodiment (FIG. 8); therefore, those identical or corresponding elements are indicated by the same reference symbols, and their detailed description will not to be repeated. Also, each pixel circuit P(i,j) in the present preferred embodiment has the same circuit configuration as of the pixel circuit P(i,j) in FIG. 10 according to the second preferred embodiment; therefore, those identical or corresponding elements are indicated by the same reference symbols, and their detailed description will not be repeated.

FIG. 11A is a fragmentary plan view which shows a construction of a TFT substrate 100*c* which is an active matrix substrate according to the present preferred embodiment. As shown in FIG. 11A, each pixel circuit P(i,j) in the present preferred embodiment is implemented by a first pixel formation portion P1*c* which includes a first-type TFT 16*c*1, or a second pixel formation portion P2*c* which includes a second-type TFT 16*c*2. Although the TFT substrate 100*c* differs from the second preferred embodiment in the size of auxiliary capacity electrode 32*c*, shape of auxiliary capacity wiring 15*c*, and connection pattern of drain electrodes D1, D2 with the auxiliary capacity electrode 32*c* in the TFT 16*c*1, 16*c*2, the overall construction is essentially the same, and gate wiring 12*c*, source wiring 14*c* and auxiliary capacity wiring 15*c* in FIG. 11A correspond to the scanning signal line G(i), the data signal line S(j) and the auxiliary capacity lines CS(j) in FIG. 8 respectively.

FIG. 11B is an enlarged plan view which shows a construction of the first-type TFT 16*c*1 or the TFT in the first pixel formation portion P1*c* whereas FIG. 11C is an enlarged plan view which shows a construction of the second-type TFT 16*c*2 or the TFT in the second pixel formation portion P2*c*. As will be clear from comparison between FIG. 11B to FIG. 9B, the first-type TFT 16*c*1 according to the present preferred embodiment has the same construction (pattern configuration) as the first-type TFT 16*b*1 according to the second preferred embodiment; so identical or corresponding elements are indicated by the same reference symbols, and their detailed description will not be repeated. Likewise, as will be clear from comparison between FIG. 11C to FIG. 9C, the second-type TFT 16*c*2 according to the present preferred embodiment has the same construction (pattern configuration) as the second-type TFT 16*b*2 according to the second preferred embodiment; so again, identical or corresponding elements are indicated by the same reference symbols, and their detailed description will not be repeated.

As shown in FIG. 11B and FIG. 11C, according to the present preferred embodiment again, the drain electrode D1 in the first-type TFT 16*c*1 is located on the upper side (as in FIGS. 11A and 11B) of the gate electrode G1 while overlapping the gate electrode G1, whereas in the second-type TFT 16*c*2, the drain electrode D2 is located on the lower side (as in FIG. 11C) of the gate electrode G2 while overlapping the gate electrode G2. Therefore, pattern misalignment resulted from the manufacturing process will increase/decrease the parasitic capacity Cgd between the source and the drain in reverse ways in the first-type TFT 16*c*1 and the second-type TFT 16*c*2. Specifically, if a formation pattern for the drain electrodes D1, D2 is shifted upward (as in FIGS. 11A and 11B) with respect to a formation pattern for the gate electrodes G1, G2, the first-type TFT 16*c*1 will have a reduced area of overlap between the gate electrode G1 and the drain electrode D1, and therefore will have a decrease in the parasitic capacity Cgd whereas the second-type TFT 16*c*2 will have an increased area of overlap between the gate electrode G2 and the drain electrode D2, and therefore will have an increase in the parasitic capacity Cgd.

As shown in FIG. 11A, in the present preferred embodiment again, the pixel array includes two kinds of TFTs, i.e. the first-type TFT 16*c*1 and the second-type TFT 16*c*2 as described above, substantially in the same number, and these two kinds are disposed in uniform dispersion in the pixel array. Specifically, the first pixel formation portions P1*c* and the second pixel formation portions P2*c* respectively including the first-type TFT 16*c*1 and the second-type TFT 16*c*2 as described above are disposed alternately to each other in the Row direction and in the Column direction. Therefore, again in the present preferred embodiment, problems such as block segmentation and flickering due to separate exposure performed in the manufacturing process are reduced by averaging of the parasitic capacities Cgd (and therefore averaging of the level shifts ΔVd) based on an arrangement that two kinds of TFTs 16b1 and 16b2 are disposed in uniform dispersion, and the same advantages are enjoyed as in the first and the second preferred embodiments.

4. Fourth Preferred Embodiment

Next, description will be made for a liquid crystal display device including a TFT substrate as an active matrix substrate according to a fourth preferred embodiment of the present invention. Again, the liquid crystal display device has an overall configuration which is essentially the same as the second preferred embodiment (FIG. 8); therefore, those identical or corresponding elements are indicated by the same reference symbols, and their detailed description will not be repeated. Also, each pixel circuit P(i,j) in the present preferred embodiment has the same circuit configuration as of the pixel circuit P(i,j) in FIG. 10 according to the second preferred embodiment; therefore, those identical or corresponding elements are indicated by the same reference symbols, and their detailed description will not be repeated.

FIG. 12A is a fragmentary plan view which shows a construction of a TFT substrate 100d which is an active matrix substrate according to the present preferred embodiment. As shown in FIG. 12A, the pixel circuit P(i,j) in the present preferred embodiment is implemented by a first pixel formation portion P1d which includes a first-type TFT 16d1, or a second pixel formation portion P2d which includes a second-type TFT 16d2. In the present preferred embodiment, source wiring 14d, which provides the data signal line S(i), is formed to pass through the center of each pixel formation portion P1d, P2d, to extend in the Column direction (hereinafter, such a structure in the TFT substrate will be called "center-source structure"), differing from the first through the third preferred embodiments. Although the present preferred embodiment differs from the first through the third preferred embodiments in terms of the size and location of auxiliary capacity electrode 32d, shape of auxiliary capacity wiring 15d, and pattern configuration in the TFTs 16d1, 16d2, the circuit configuration is essentially the same as the second embodiment as mentioned above, with gate wiring 12d, source wiring 14d and auxiliary capacity wiring 15d in FIG. 12A corresponding to the scanning signal line G(i), the data signal line S(j) and the auxiliary capacity line CS(j) in FIG. 8, respectively.

FIG. 12B is an enlarged plan view which shows a construction of the first-type TFT 16d1 in the first pixel formation portion P1d whereas FIG. 12C is an enlarged plan view which shows a construction of the second-type TFT 16d2 in the second pixel formation portion P2d. As will be clear from comparison between FIG. 12B to FIG. 9B, the first-type TFT 16d1 according to the present preferred embodiment uses the construction (pattern configuration) of the first-type TFT 16b1 according to the second preferred embodiment as rotated by 90 degrees. Likewise, as will be clear from comparison between FIG. 12C to FIG. 9C, the second-type TFT 16d2 according to the present preferred embodiment uses the construction (pattern configuration) of the second-type TFT 16b2 according to the second preferred embodiment as rotated by 90 degrees; so, identical or corresponding elements are indicated by the same reference symbols, and their detailed description will not be repeated.

As shown in FIG. 12B and FIG. 12C, according to the present preferred embodiment, the drain electrode D1 in the first-type TFT 16d1 is located on the left side (as in FIGS. 12A and 12B) of the gate electrode G1 while overlapping on the gate electrode G1, whereas in the second-type TFT 16d2, the drain electrode D2 is located on the right side (as in FIG. 12C) of the gate electrode G2 while overlapping on the gate electrode G2. Therefore, pattern misalignment in the right-left direction (as in FIGS. 12A-12C) during the manufacturing process will increase/decrease the parasitic capacity Cgd between the source and the drain as compared to the case where there is no pattern misalignment, and the increase/decrease occurs in reverse ways in the first-type TFT 16d1 and the second-type TFT 16d2. (It should be noted that pattern misalignment in an up-down direction and not greater than a certain tolerable amount will not change the parasitic capacity Cgd). Specifically, if a formation pattern for the drain electrodes D1, D2 is shifted leftward (as in FIGS. 12A-12C) with respect to a formation pattern for the gate electrodes G1, G2, the first-type TFT 16d1 will have a reduced area of overlap between the gate electrode G1 and the drain electrode D1, and therefore will have a decrease in the parasitic capacity Cgd whereas the second-type TFT 16d2 will have an increased area of overlap between the gate electrode G2 and the drain electrode D2, and therefore will have an increase in the parasitic capacity Cgd.

As shown in FIG. 12C, in the present preferred embodiment again, the pixel array includes two kinds of TFTs, i.e. the first-type TFT 16d1 and the second-type TFT 16d2 as described above, substantially in the same number, and these two kinds are distributed in uniform dispersion in the pixel array. Specifically, the first pixel formation portions P1d and the second pixel formation portions P2d respectively including the first-type TFT 16d1 and the second-type TFT 16d2 as described above are disposed alternately to each other in both of the Row direction and Column direction. Therefore, again in the present preferred embodiment, problems such as block segmentation and flickering due to separate exposure performed in the manufacturing process are reduced by averaging of the parasitic capacities Cgd (and therefore averaging of the level shifts ΔVd) based on an arrangement that two kinds of TFTs 16d1 and 16d2 are disposed in uniform dispersion, and the same advantages are enjoyed as in the first through the third preferred embodiments.

5. Variations

5.1 Pixel Structure

Figure 13B:
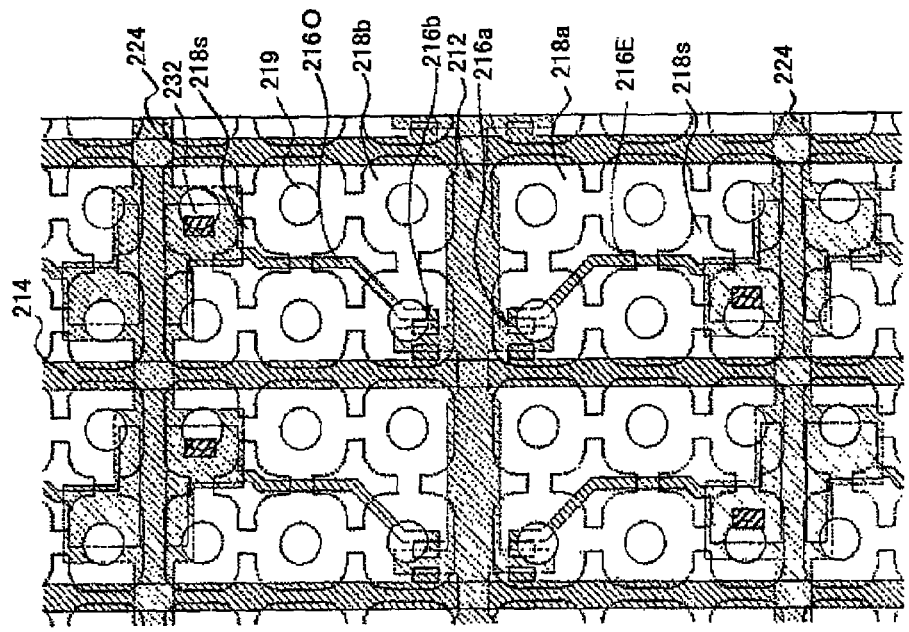
FIGS. 13A and 13B are fragmentary plan views which show a construction of another active matrix substrate according to a variation to which the present invention is applicable.
Figure 13A:
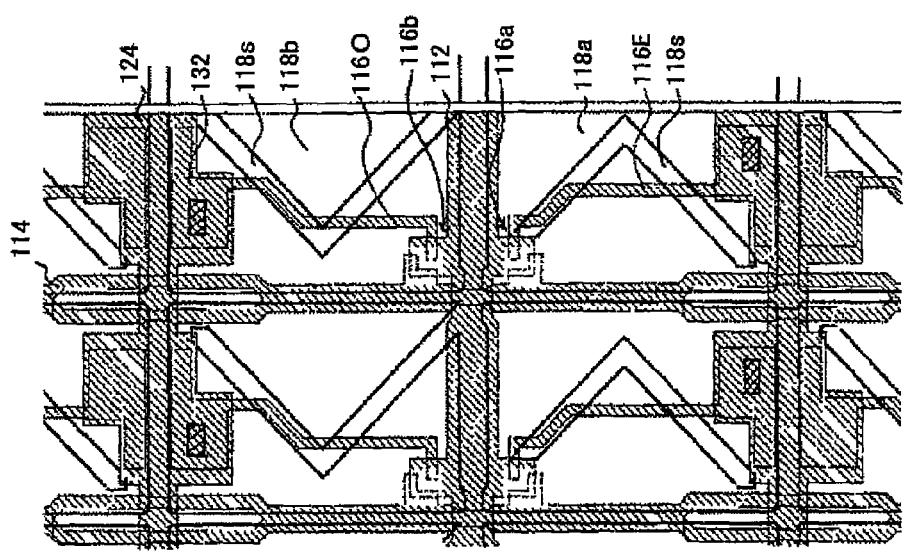

FIG. 13A shows a pixel structure in a liquid crystal display device of a multi-domain vertical aligned mode (MVA mode) disclosed in JP-A No. 2004-78157 Gazette. A pixel formation portion is constituted by a first subpixel which includes a first pixel electrode 118a and a first TFT 116a, and a second subpixel which includes a second pixel electrode 118b and a second TFT 116b. With this construction, a scanning line (gate wiring) 112 is provided between the first subpixel and the second subpixel. In essence, a pixel portion is divided into two subpixels by a gate wire 112 which passes through a center of the region (hereinafter this structure will be called "center-gate structure"). The present invention is applicable to such a TFT substrate serving as an active matrix substrate. Specifically, if a voltage applied to the liquid crystal capacity Clc1 formed by the first pixel electrode 118a and the opposed electrode differs from a voltage applied to the liquid crystal capacity Clc2 formed by the second pixel electrode 118b and the opposed electrode in a pixel portion, each of the first and the second subpixels is an equivalent to a pixel formation portion in each of the embodiments described above. Therefore, in the example given in FIG. 13A, the first TFT 116a may be provided by one of the first-type TFTs 16a1 through 16d1 while the second TFT 116b is provided correspondingly by the second-type TFT 16a2 through 16d2, whereby it is possible to provide the same advantages as offered by the embodiments so far described. In FIG. 13A, reference symbol "114" indicates a signal line (source wiring), reference symbol "118s" indicates a slit formed in the first and the second pixel electrodes 118a, 118b, reference symbol "124" indicates auxiliary capacity wiring, reference symbol "132" indicates an auxiliary capacity electrode, reference symbol "116E" indicates an extended portion of the drain electrode of the first TFT 116a, and reference symbol "1160" indicates an extended portion of the drain electrode of the second TFT 116b.

FIG. 13B shows a pixel structure in a liquid crystal display device of an axially symmetric-aligned micro-cell mode (ASM mode) disclosed in JP-A No. 2004-78157 Gazette. This is another example of TFT substrate which has a center-gate structure. Again in this example, if a voltage applied to the liquid crystal capacity Clc1 formed by the first pixel electrode 218a and the opposed electrode differs from a voltage applied to the liquid crystal capacity Clc2 formed by the second pixel electrode 218b and the opposed electrode, in a pixel portion, each of the first and the second subpixels is an equivalent to a pixel formation portion in each of the preferred embodiments described above. Specifically, in the present example, the first TFT 216a included in the first pixel portion may be provided by one of the first-type TFTs 16a1 through 16d1 while the second TFT 216b included in the second pixel portion is provided correspondingly by the second-type TFT 16a2 through 16d2, whereby it is possible to provide the same advantages as offered by the embodiments so far described. In FIG. 13B, reference symbol "212" indicates a scanning line (gate wiring), reference symbol "214" indicates a signal line (source wiring), reference symbol "218s" indicates a slit formed in the first and the second pixel electrodes 218a, 218b, reference symbol "219" indicates a projected portion serving as a rib, reference symbol "224" indicates auxiliary capacity wiring, reference symbol "232" indicates an auxiliary capacity electrode, reference symbol "216E" indicates an extended portion of the drain electrode of the first TFT 216a, and reference symbol "2160" indicates an extended portion of the drain electrode of the second TFT 216b.

Figure 14B:
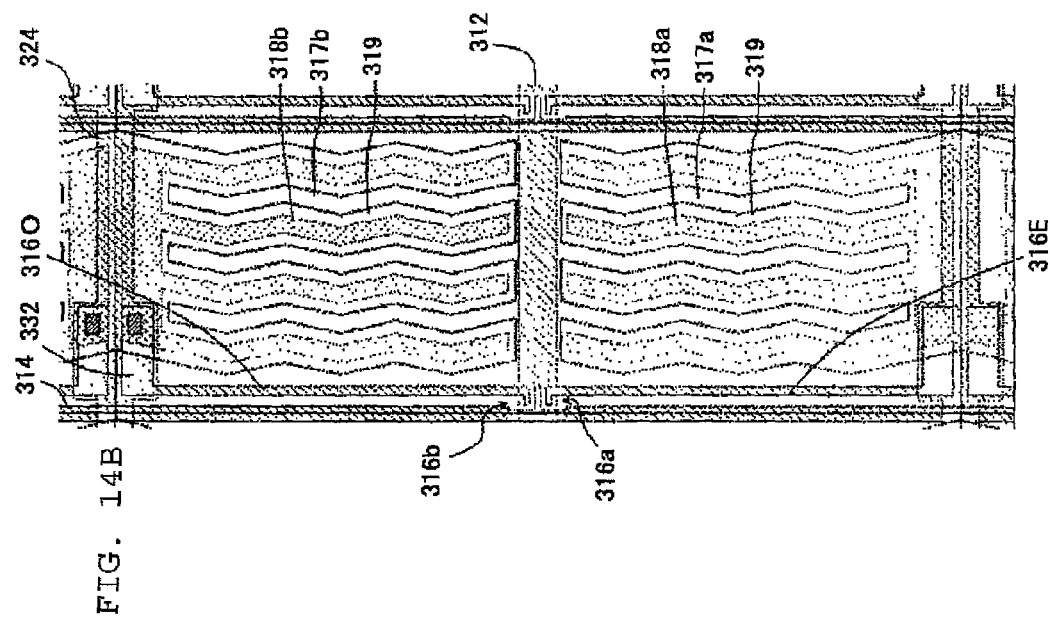
FIGS. 14A and 14B are fragmentary plan views which show a construction of another active matrix substrate according to a variation to which the present invention is applicable.
Figure 14A:
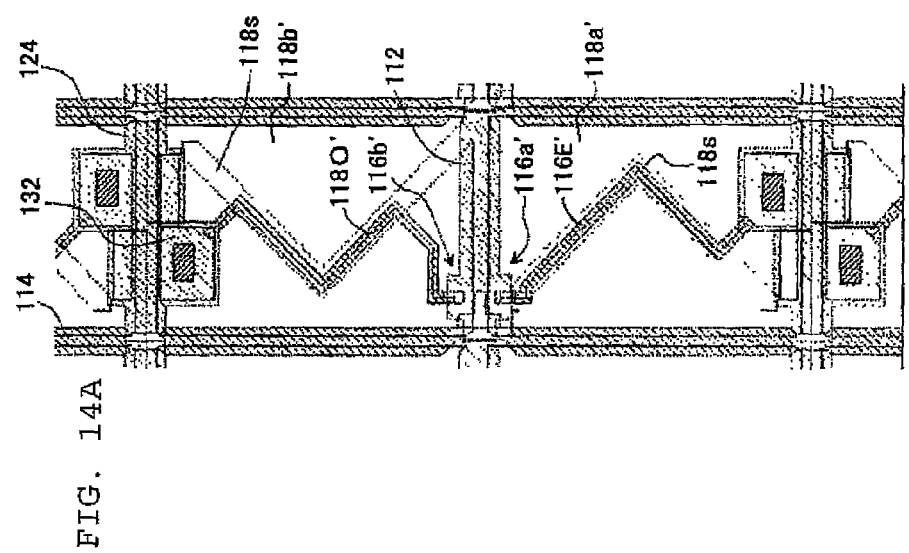

FIG. 14A shows another pixel structure in a liquid crystal display device of an MVA mode disclosed in JP-A No. 2004-78157 Gazette. This is another example of TFT substrate which has a center-gate structure. In this example, drain electrode extensions 116E' and 1160' are almost entirely overlapped to respective slits 118S formed in their corresponding subpixel electrodes 118a' and 118b', for a purpose of increased aperture. Again in this example, if a voltage applied to the liquid crystal capacity Clc1 formed by the first pixel electrode 118a' and the opposed electrode differs from a voltage applied to the liquid crystal capacity Clc2 formed by the second pixel electrode 118b' and the opposed electrode in a pixel portion, each of the first and the second subpixels is an equivalent to a pixel formation portion in each of the preferred embodiments described above, and therefore, it is possible to apply the present invention. Specifically, in the present example, the first TFT 116a' may be provided by one of the first-type TFTs 16a1 through 16d1 while the second TFT 116b' is provided correspondingly by the second-type TFT 16a2 through 16d2, whereby it is possible to provide the same advantages as offered by the preferred embodiments so far described. In FIG. 14A, reference symbol "112" indicates a scanning line (gate wiring), reference symbol "114" indicates a signal line (source wiring), reference symbol "124" indicates auxiliary capacity wiring, and reference symbol "132" indicates an auxiliary capacity electrode.

FIG. 14B shows a pixel structure in a liquid crystal display device of an in-plane switching mode (IPS mode) disclosed in JP-A No. 2004-78157 Gazette. This is still another example of TFT substrate which has a center-gate structure. In this example, a liquid crystal layer is located at a place 319 between a subpixel electrode 318a or 318b and an opposed electrode 317a or 317b, and an electric field (lateral field) is generated in the liquid crystal layer. The electric field is substantially parallel to the liquid crystal layer surface. In this example, a pixel portion is constituted by two subpixels, of which a TFT 316a in the first subpixel and a TFT 316b in the second subpixel each have a TFT on-gate structure, sharing a source electrode which is formed integrally with the signal line serving as source wiring. Such a TFT substrate which has the TFT on-gate structure can also be considered as an example to which the present invention is applicable, and it is possible to provide the same advantages as offered by the preferred embodiments so far described because the pixel array has a uniform dispersion of two kinds of TFTs which have a mutually reversed pattern in terms of increases/decreases in the parasitic capacity Cgd caused by pattern misalignment in a predetermined direction. In FIG. 14B, reference symbol "312" indicates a scanning line (gate wiring), reference symbol "314" indicates a signal line (source wiring), reference symbol "324" indicates auxiliary capacity wiring, reference symbol "332" indicates an auxiliary capacity electrode, reference symbol "316E" indicates an extended portion of the drain electrode of the first TFT 316a, and reference symbol "3160" indicates an extended portion of the drain electrode of the second TFT 316b.

In the above-described variations shown in FIG. 13A, FIG. 13B, FIG. 14A and FIG. 14B, one pixel portion is provided by two subpixels; however, the same advantages as offered by these can be enjoyed if the pixel portion is constituted by three or more subpixels, from the arrangement that the pixel array has substantially uniform dispersion of two kinds of TFTs, i.e. the first and the second TFTs according to one of the preferred embodiments described above, and these TFTs have a mutually reversed pattern in terms of increases/decreases in the parasitic capacity Cgd caused by pattern misalignment in a predetermined direction. Also, in the variations shown in FIG. 13A, FIG. 13B, FIG. 14A and FIG. 14B, there are cases where two subpixels (but more specifically a plurality of subpixels) which constitute one pixel portion are supplied with the same voltage. In such a case, too, the present invention offers the same advantages in terms of reducing block segmentation and flickering caused by separate exposure performed at the time of manufacture although there are some disadvantages, as compared to other preferred embodiments described so far, in terms of aperture ratio and parasitic capacity per pixel as a minimum unit of image formed by an active matrix substrate provided by a TFT substrate and in terms of display quality in a wide view angle mode.

5.2 TFT Construction

The TFTs in a TFT substrate as an active matrix substrate according to various preferred embodiments of the present invention may have many other structures than those TFT structures used in the embodiments disclosed so far. For example, it is possible to provide the same advantages as offered by the preferred embodiments so far described, by substantially uniform dispersion of two kinds of TFTs of the following construction, in the pixel array.

Figure 15A:
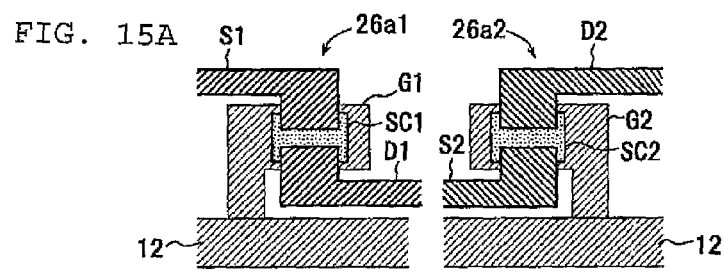
FIGS. 15A-15D are plan views which show various constructions of TFTs that are usable in the active matrix substrate according to the first through the third preferred embodiments.
Figure 15B:
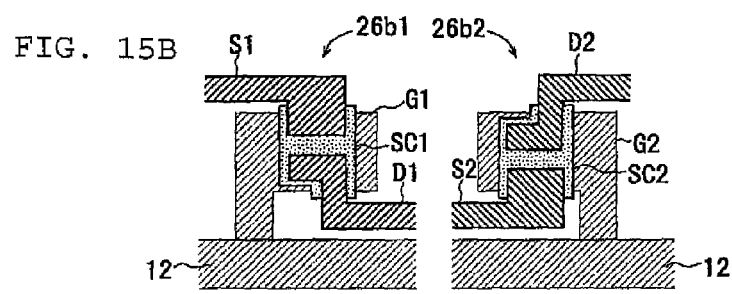
Figure 15C:
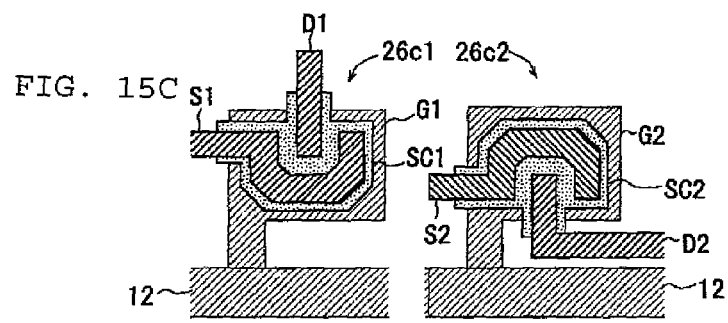
Figure 15D:
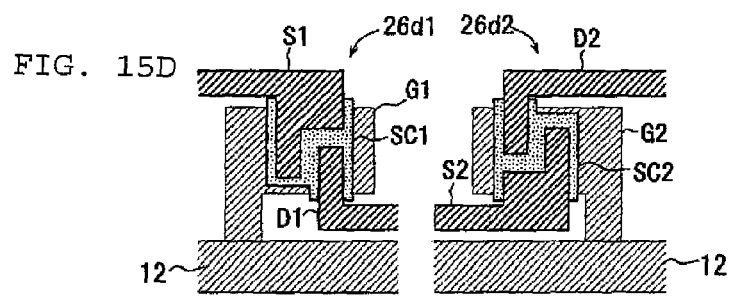

In the above-described first through the third preferred embodiments (FIG. 2, FIG. 9A and FIG. 11A), the two kinds of TFTs (the first-type TFTs 16a1 through 16c1 and the second-type TFTs 16a2 through 16c2) may be provided by any of: two kinds of TFTs 26a1 and 26a2 in FIG. 15A, two kinds of TFTs 26b1 and 26b2 in FIG. 15B, two kinds of TFTs 26c1 and 26c2 in FIG. 15C, and two kinds of TFTs 26d1 and 26d2 in FIG. 15D. Note that in FIG. 15A through FIG. 15D, the drain electrode, the source electrode, the gate electrode and the semiconductor layer in one of the two kinds of TFTs 26a1 through 26d1 are indicated by reference symbols "D1", "S1", "G1" and "SC1" respectively, whereas the drain electrode, the source electrode, the gate electrode and the semiconductor layer in the other TFTs 26a2 through 26d2 are indicated by reference symbol "D2", "S2", "G2" and "SC2" respectively. Gate wiring is indicated by reference symbol "12".

Figure 16A:
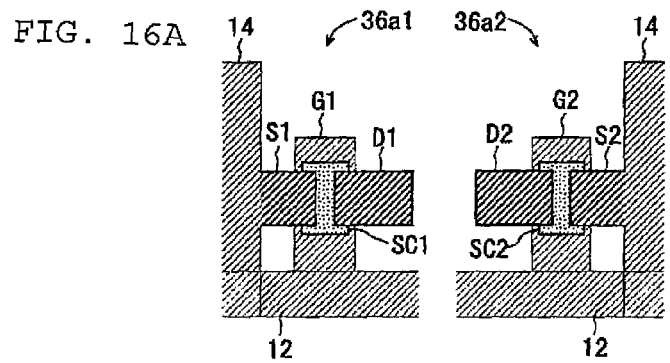
FIGS. 16A-16D are plan views which show various kinds of TFTs which are usable when applying the present invention to an active matrix substrate of a center-source structure.
Figure 16B:
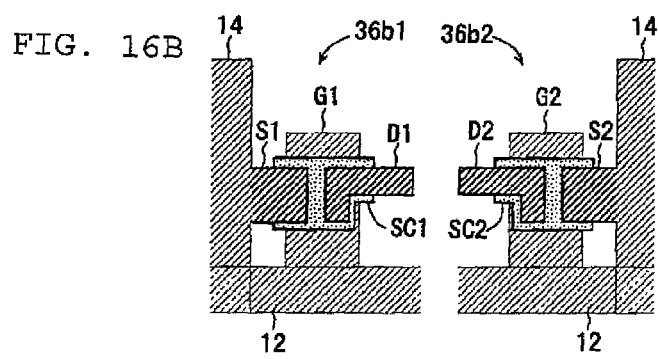
Figure 16C:
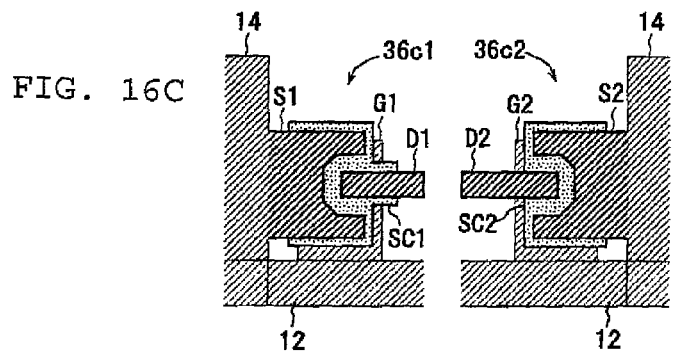
Figure 16D:
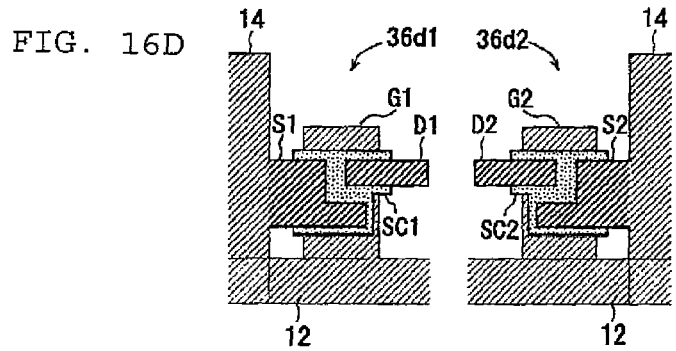

Likewise, in the fourth preferred embodiment where the TFT has a center-source structure (FIG. 12A), the two kinds of TFTs (the first-type TFT 16d1 and the second-type TFT 16d2) may be provided by any of: two kinds of TFTs 36a1 and 36a2 in FIG. 16A, two kinds of TFTs 36b1 and 36b2 in FIG. 16B, two kinds of TFTs 36c1 and 36c2 in FIG. 16C, and two kinds of TFTs 36d1 and 36d2 in FIG. 16D. Note that in FIG. 16A through FIG. 16D, the drain electrode, the source electrode, the gate electrode and the semiconductor layer in one of the two kinds of TFTs 36a1 through 36d1 are indicated by reference symbols "D1", "S1", "G1" and "SC1" respectively, whereas the drain electrode, the source electrode, the gate electrode and the semiconductor layer in the other TFTs 36a2 through 36d2 are indicated by reference symbol "D2", "S2", "G2" and "SC2" respectively. Gate wiring is indicated by reference symbol "12", while source wiring is indicated by reference symbol "14".

Further, in the above-described variations where the TFT has a center-gate structure (FIG. 13A, FIG. 13B, FIG. 14A and FIG. 14B), the two kinds of TFTs (TFT 116a, TFT 116b, etc.) may be provided by any of: two kinds of TFTs 46a1 and 46a2 in FIG. 17A, two kinds of TFTs 46b1 and 46b2 in FIG. 17B, two kinds of TFTs 46c1 and 46c2 in FIG. 17C, two kinds of TFTs 46d1 and 46d2 in FIG. 17D, and two kinds of TFTs 46e1 and 46e2. The TFTs which have the structures shown in FIG. 17A through FIG. 17C are disclosed in JP-A No. 2004-78157 Gazette, but the Gazette does not make any reference to the problems of or solutions to block segmentation and flickering due to separate exposure performed during manufacturing process, i.e. an advantage achieved by preferred embodiments of the present invention. It should be noted here that two kinds of TFTs 46a1 and 46a2 in FIG. 17A, two kinds of TFTs 46b1 and 46b2 in FIG. 17B, and two kinds of TFTs 46c1 and 46c2 in FIG. 17C, have an on-gate structure, where the gate electrode G, source electrode S and semiconductor layer SC are shared by the two. In FIG. 17A through FIG. 17C, the drain electrode in one of the two kinds of TFTs 46a1 through 46c1 is indicated by reference symbol "D1", whereas the drain electrode in the other of the two kinds of TFTs 46a2 through 46c2 is indicated by reference symbol "D2". Likewise, two kinds of TFTs 46d1 and 46d2 in FIG. 17D as well as two kinds of TFTs 46e1 and 46e2 in FIG. 17E share the gate electrode G and the semiconductor layer SC. (Note that the TFTs 46e1 and 46e2 in FIG. 17E also share the source electrode S and the semiconductor layer SC.) In FIG. 17D, the drain electrode, the source electrode and the semiconductor layer in one of the two kinds of TFTs 46d1 are indicated by reference symbols "D1", "S1" and "SC1", whereas the drain electrode, the source electrode and the semiconductor layer in the other of the two, i.e. TFT 46d2, are indicated by reference symbols "D2", "S2" and "SC2" respectively. Likewise, in FIG. 17E, the drain electrode in one of the two kinds of TFTs or TFT 46e1 is indicated by reference symbol "D1" whereas the drain electrode in the other of the two or TFT 46e2 is indicated by reference symbol "D2".

5.3 TFT Layout Pattern

In each of the above-described preferred embodiments, the first-type TFTs 16a1 through 16d1 and the second-type TFTs 16a2 through 16d2 (or the first pixel formation portions P1 and the second pixel formation portions P2 including these TFTs) are disposed alternately to each other in both of the Row direction and the Column direction (FIG. 2, FIG. 9A and FIG. 11A). It is preferable that the two kinds of TFTs such as the first-type TFTs 16a1 through 16d1 and the second-type TFTs 16a2 through 16d2 be dispersed uniformly in the pixel array, in accordance with the method of driving the TFT substrate as an active matrix substrate according to the present preferred embodiment. Hereinafter, description will cover preferred layout patterns for each drive method in the liquid crystal display devices which use a TFT substrate according to the above-described preferred embodiments and variations.

Figures 18A, 18B, 18C:
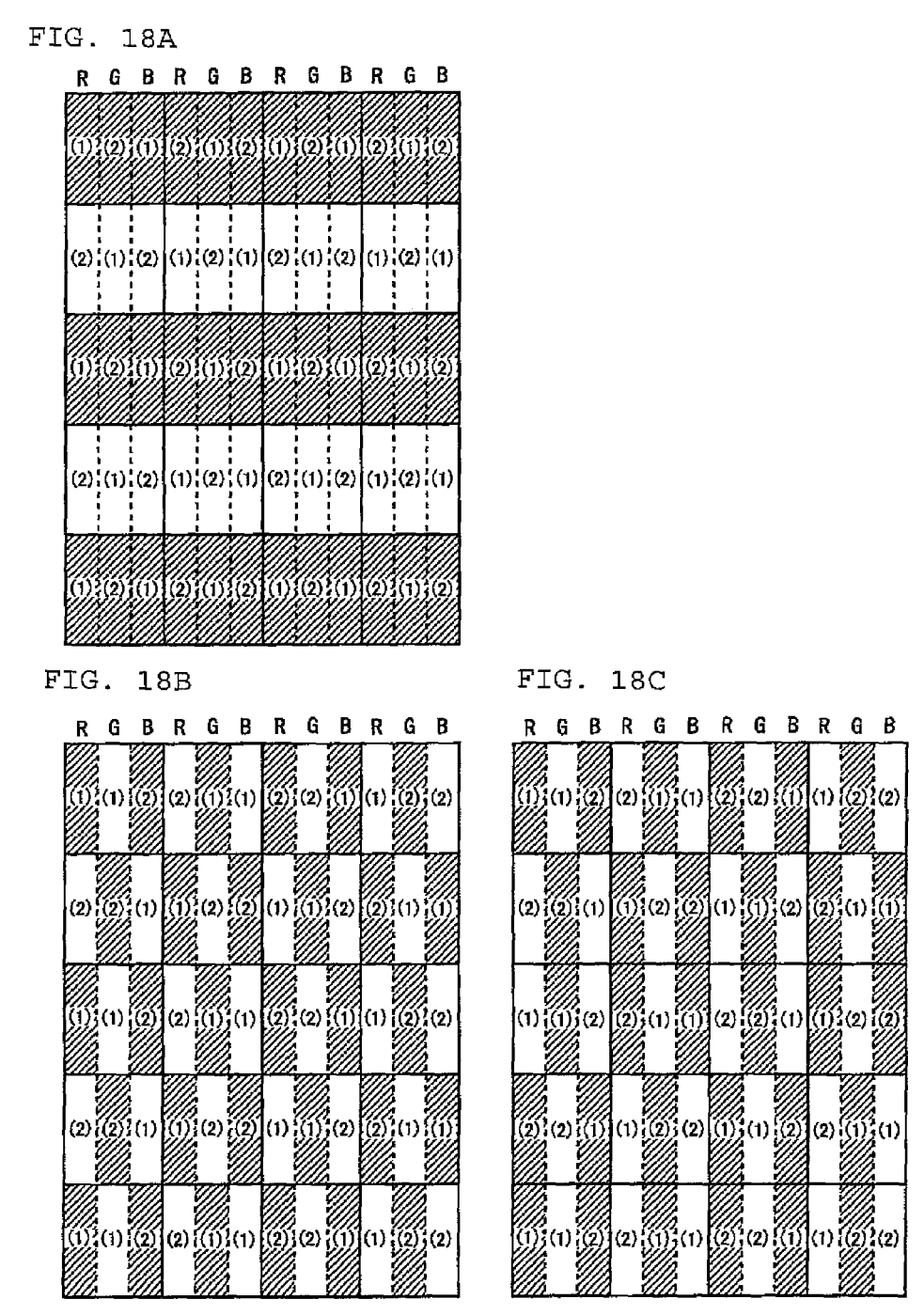

FIG. 18A through FIG. 18C show preferred layout patterns of TFTs in a liquid crystal display device which uses an active matrix substrate of a pixel structure (including the center-source structure) as described in the first through the fourth preferred embodiments. The patterns are for line inversion drive method, 1H dot inversion drive method and 2H dot inversion drive method. FIG. 18A through FIG. 18C show conceptual illustrations of a pixel array, and symbols "R", "G" and "B" given above the upper side indicate that the corresponding rows right below are constituted by pixels of red, green and blue respectively. Also, in FIG. 18A through FIG. 18C, each pixel is represented by a small rectangle with an indication number "(1)" or "(2)". The pixel (pixel formation portion) indicated by "(1)" includes the first-type TFT while "(2)" indicates that the pixel includes the second-type TFT. As has been described earlier, the first-type TFT and the second-type TFT are in a reverse relationship with each other in terms of increase/decrease in the parasitic capacity Cgd caused by pattern misalignment in a predetermined direction. Also, in FIG. 18A through FIG. 18C, small hatched rectangles represent pixels displaying black while those which are not hatched represent pixels displaying white. In all of the black displaying pixels, the applied voltage is of the same one polarity (e.g., positive) of the positive and negative polarities whereas the voltage is of the same other polarity (e.g., negative) in all of the white displaying pixels. Such a method of depiction as used in FIG. 18A through FIG. 18C will be used also in later description to be made with reference to FIG. 20 and FIG. 21.

In a liquid crystal display device which uses line inversion drive method, each scanning signal line G(j) is supplied with a scanning signal Vg(j) (j=1 through M) as shown in FIG. 19A, and each data signal line S(i) is supplied with a data signal Vs(i) whose polarity (with reference to the opposed electrode Ec) is inverted as shown in FIG. 19B. Through this process, polarity of the voltage applied to the liquid crystal layer (and therefore polarity of the voltage applied to pixel capacities or liquid crystal capacities) is inverted not only for each frame period but also for each scanning signal line (spatially). With this, take a case of displaying a pattern of alternate black and white horizontal lines (hereinafter called "horizontal stripe pattern") in a conventional liquid crystal display device. In all of the black displaying pixels, the applied voltage is of the same polarity (e.g. positive) whereas in all of the white displaying pixels, the applied voltage is of the same polarity (e.g. negative), and further, the voltage polarity in each pixel capacity is inverted for each frame period; therefore, if pixel electric potential has positive/negative inconsistency caused by pattern misalignment, it is perceived as flickering when the pattern is displayed (hereinafter, such a unique pattern which is likely to cause "flickering" in a particular drive method will be called "flicker pattern" for the drive method). On the contrary, take an example in FIG. 18A, where the first-type TFT and the second-type TFT are laid alternately to each other in both of the Row direction and the Column direction in the pixel array. Then, even if there is pattern misalignment per segmented region resulting from separate exposure at the time of manufacture, the increase/decrease in the parasitic capacity Cgd caused by the pattern misalignment and the pixel electric potential level shift ΔVd based thereon are averaged in the white display region (the averaging occurs also in the black display region but is essentially invisible). Because of this, human viewers do not perceive the flickering. Also, since luminance variation per pixel electrode is averaged between mutually adjacent pixels, the viewers do not perceive block segmentation, either.

In a liquid crystal display device which uses 1H dot inversion drive method, each scanning signal line G(j) is supplied with a scanning signal Vg(j) (j=1 through M) as shown in FIG. 19A, and each data signal line S (i) is supplied with a data signal Vs(i), whose polarity (with reference to the opposed electrode) is inverted as shown in as shown in FIG. 19C. Through this process, polarity of the voltage applied to the liquid crystal layer (and therefore polarity of the voltage applied to pixel capacities or liquid crystal capacities) is inverted not only for each frame period but also for each scanning signal line as well as each data signal line (i.e. spatially). With this, if a pattern of alternate black and white in both of the Row direction and Column direction (hereinafter called "checker pattern") is displayed in a conventional liquid crystal display device, flickering is likely to occur in the display. In other words, 1H dot inversion drive method has a checker pattern as a flicker pattern. On the contrary, take an example in FIG. 18B, where the first-type TFT and the second-type TFT are laid alternately to each other in the Row direction with two TFTs as a unit of alternation, and in the Column direction, with a single TFT as a unit of alternation, in the pixel array. Then, even if there is pattern misalignment per segmented region resulting from separate exposure performed at the time of manufacture, the increase/decrease in the parasitic capacity Cgd caused by the pattern misalignment and the pixel electric potential level shift ΔVd based thereon are averaged in the white display region. Because of this, human viewers do not perceive the flickering nor block segmentation.

In a liquid crystal display device which uses 2H dot inversion drive method, each scanning signal line G(j) is supplied with a scanning signal Vg(j) (j=1 through M) as shown in FIG. 19A, and each data signal line S(i) is supplied with a data signal Vs(i), whose polarity (with reference to the opposed electrode) is inverted as shown in FIG. 19D. Through this process, polarity of the voltage applied to the liquid crystal layer (and therefore polarity of the voltage applied to pixel capacities or liquid crystal capacities) is inverted not only for each frame period but also for each set of two scanning signal lines as well as each data signal line (spatially). In this case, the flicker pattern for this method is a modified checker pattern as shown in FIG. 18C. On the contrary, an example in FIG. 18C uses the same arrangement as in the 1H inversion drive method, i.e. the first-type TFT and the second-type TFT are laid alternately, with two TFTs as a unit of alternation in the Row direction, and with a single TFT as a unit of alternation in the Column direction, in the pixel array. Then, even if there is pattern misalignment per segmented region resulting from separate exposure at the time of manufacture, the increase/decrease in the parasitic capacity Cgd caused by the pattern misalignment and the pixel electric potential level shift ΔVd based thereon are averaged in the white display region. Because of this, human viewers do not perceive the flickering nor block segmentation. It should be noted here that there are cases where one type of liquid crystal display panel is used in both of the 1H dot inversion method and 2H dot inversion method; however, using the same TFT layout pattern as shown in FIG. 18B and FIG. 18C makes it possible to handle such cases.

Figures 20A, 20B, 20C:
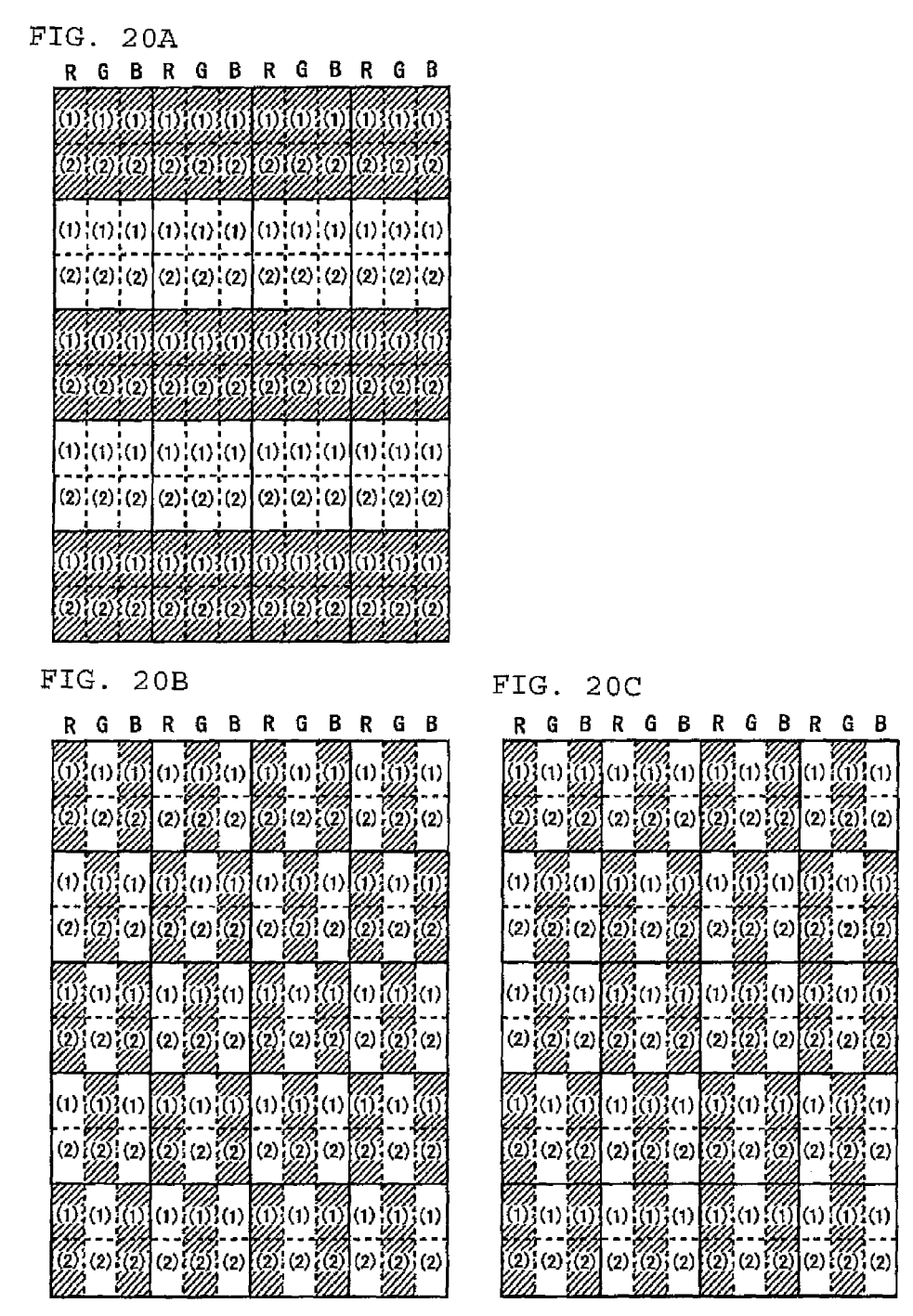

FIG. 20A through FIG. 20C shows preferred layout patterns of TFTs in a liquid crystal display device which uses an active matrix substrate of the center-gate structure as described in the variations (FIG. 13A, FIG. 13B, FIG. 14A and FIG. 14B). The patterns are for line inversion drive method, 1H dot inversion drive method and 2H dot inversion drive method. In the center-gate structure, a pixel as in the first through the fourth preferred embodiments is divided into two, i.e. an upper and a lower, subpixels. Therefore, there should be an arrangement that each pixel includes the first-type TFT in one of the two constituent subpixels and the second-type TFT in the other. Then, with whichever of the line inversion drive method, 1H dot inversion drive method and 2H dot inversion drive method selected as the drive method, increase/decrease in the parasitic capacity Cgd caused by the pattern misalignment and the pixel electric potential level shift ΔVd based thereon are averaged in the white display region. Because of this, human viewers do not perceive the flickering nor block segmentation.

Figure 21A:
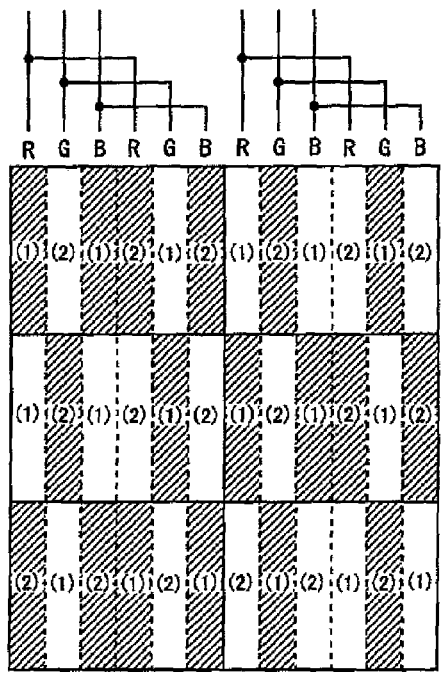
FIG. 21A is a conceptual diagram which shows a preferred TFT layout pattern for a dot inversion drive method in a liquid crystal display device which makes use of an active matrix substrate in which two pixels of the same color is driven by the same signal.
Figure 21B:
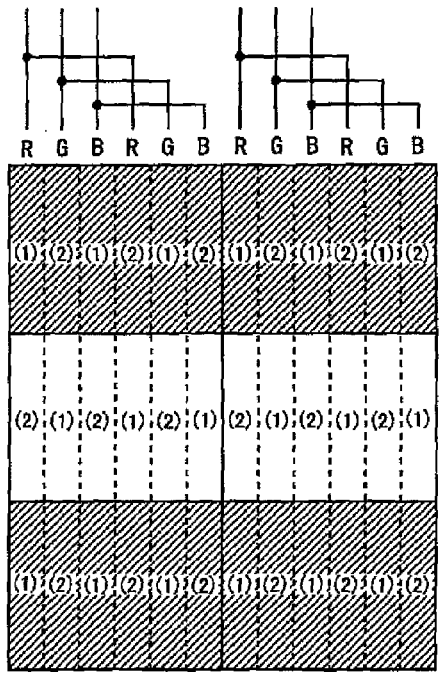
FIG. 21B is a conceptual diagram which shows a preferred TFT layout pattern for a line inversion drive method in the liquid crystal display device.

Now, there are other cases, depending on the pixel size of a liquid crystal display device, where human viewers will perceive a display as grainy and unnatural, or perceive a solid white pattern in a color liquid crystal display device as a black-and-white vertical stripe pattern because the viewers perceive differences in color-filter transmissivity and differences in luminosity factor between colors. This problem is already addressed in a liquid crystal display device which makes use of an active matrix substrate (of one-signal-drives-two-pixels method) as shown in FIG. 21A and FIG. 21B; specifically, the pixel size in the horizontal (Row) directions is halved, and a set of two pixels which are mutually in proximity to each other in the horizontal direction is driven by the same data signal (thereby displaying in the same tone). In the case of such a construction, there should be an arrangement as shown in FIG. 21A that the first-type TFT is included in one of the two same-color pixels which are driven by the same signal, and the second-type TFT is included in the other. In other words, the first-type TFT and the second-type TFT are alternated one after the other in the Row direction, and two after the other two in the Column direction. Then, with 1H dot inversion drive method selected as the drive method, increase/decrease in the parasitic capacity Cgd caused by the pattern misalignment and the pixel electric potential level shift ΔVd based thereon are averaged in the white display region when the flicker pattern is displayed. Because of this, human viewers do not perceive the flickering nor block segmentation. The same applies also to cases where line inversion drive method or 2H dot inversion drive method is used. For a case where line inversion drive method is used, the arrangement may be as shown in FIG. 21B; namely the first-type TFT and the second-type TFT are alternated to each other in both of the Row direction and the Column direction. It should be noted here however, that if dot inversion drive method is used in the TFT layout pattern in FIG. 21B, the flicker pattern in FIG. 21A will make visible that the same type of TFTs are placed in close proximity in each of the black and white display regions. Therefore, dot inversion drive method is not a preferred method for the TFT layout pattern in FIG. 21B.

Figure 21C:
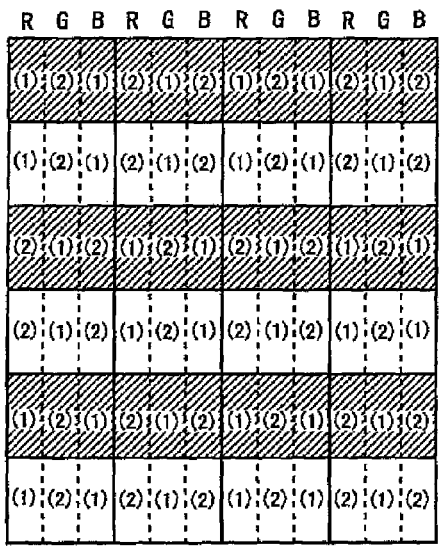
FIG. 21C is a conceptual diagram which shows a preferred TFT layout pattern for a line inversion drive method in the liquid crystal display device regardless of whether the active matrix substrate is driven based on one-signal-drives-two-pixels method.

Further, for the same reason, the arrangement as shown in FIG. 21A that the first-type TFT and the second-type TFT are alternated one after the other in the Row direction, and two after the other two in the Column direction is effective in line inversion drive method regardless of whether the active matrix substrate is of one-signal-drives-two-pixels method (See FIG. 21C).

It should be noted further, that the TFT layout patterns shown in FIG. 18A through FIG. 21C selected appropriately to the drive method employed will also provide the advantage when any one of the RGB colors (e.g. red) or any two thereof (e.g. red and blue) are displayed in the entire screen. Specifically, human viewers do not perceive the flickering nor block segmentation because of the uniformly dispersed layout of the first-type TFTs and the second-type TFTs in each of the regions which display a given single color or two colors.

5.4 Other Application Examples of Preferred Embodiments of the Present Invention In each of the above preferred embodiments, description takes a TFT substrate as an example of active matrix substrate used in a liquid crystal display device; however, the present invention is applicable to other active matrix substrates as long as it includes: a matrix of pixels (pixel formation portions or pixel circuits) each having a TFT and an electrostatic capacitance (voltage holding capacitor) which is equivalent to a pixel capacity formed by a pixel electrode and another electrode; and scanning signal lines, data signal lines, etc. disposed in a grid pattern as described earlier. An example device which includes such an active matrix substrate is an EL (electroluminescence) display device, and the present invention is applicable as a device to reduce block segmentation and other problems caused by separate exposure performed at the time of manufacture. In this case, the capacitor which has an electrostatic capacitance for holding a voltage that is equivalent to the pixel value is provided by a voltage holding electrode (equivalent to the pixel electrode in the previous preferred embodiments) which is connected with a drain electrode of the TFT in the pixel formation portion, and an electrode of a power line or of a grounding line which is an equivalent to the auxiliary capacity line. It should be noted here however, that depending upon the method of driving the organic EL display device, there may be an additional TFT which serves as a switching element placed between the source electrode of the original TFT and the data signal line, or there may still be a case where an additional TFT which serves as a switching element and a capacity element (capacitor) connected in series thereto are placed between the source electrode of the original TFT and the data signal line.

Figure 24:
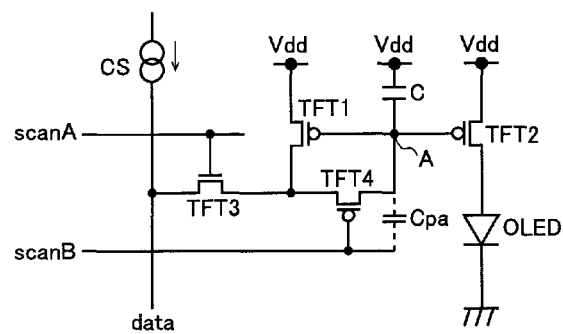
FIG. 24 is a circuit diagram for describing how preferred embodiments of the present invention can be applied to an organic EL display device.

An organic EL display device may use a pixel circuit of a configuration as shown in FIG. 24 (See JP-A No. 2001-147659 Gazette). Referring to this pixel circuit, when scanning lines Scan A and Scan B are selected, a TFT 3 and a TFT 4 are turned ON, and the current from a current source CS flows to the TFT 1 to charge a holding capacitor C with a gate-source voltage which corresponds to the current flowing through the TFT 1. Thereafter, when the scanning line Scan B is deselected, the TFT 4 is turned OFF, and the voltage charged in the holding capacitor C stays. An electric current based on the charged voltage in the holding capacitor C flows to the driving TFT 2, and this current causes the light emitting element OLED to emit light. In this operation, when the TFT 4 changes its state from ON to OFF, a level shift occurs as does in the previous preferred embodiments due to the parasitic capacity Cpa in the TFT 4. This means that if separate exposure was performed at the time of manufacture which left pattern misalignment of different extent in the segmented regions, the shift will cause such a phenomenon as emission luminance differing from one segmented region to another (block segmentation), i.e. poor display quality. In such a pixel circuit, a portion indicated by a symbol "A" represents the voltage holding electrode for forming the voltage holding capacitor C, and the data line "data" is connected with the voltage holding electrode (A) via the TFT 3 and the TFT 4 which serve as switching elements. The TFT 4 is turned ON/OFF by the scanning line Scan B, and the parasitic capacity Cpa in the TFT 4 corresponds to the parasitic capacity Cgd in the TFT 102 of the pixel circuit according to the first and the second preferred embodiments. Therefore, the present invention is applicable also to active matrix substrates for organic EL display device which has a pixel circuit of the configuration shown in FIG. 24, in order to average increase/decrease in the parasitic capacity Cpa and resulting increase/decrease in the level shift due to pattern misalignment made at the time of manufacture.

Figure 25:
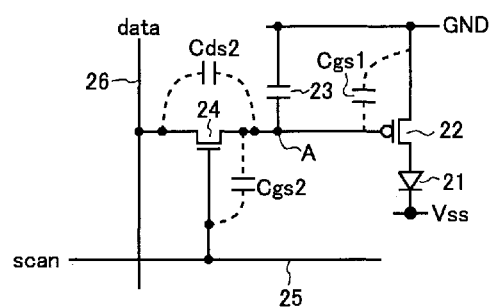
FIG. 25 is a circuit diagram for describing how preferred embodiments of the present invention can be applied to an organic EL display device.

Also, an organic EL display device may use a pixel circuit of a configuration as shown in FIG. 25 (See JP-A No. 2002-156923 Gazette.) Referring to this pixel circuit, when a scanning line 25 ("scan") is selected, a TFT 24 is turned ON, and a data voltage in a data line 26 ("data") is held at a holding capacity 23(Cs). Thereafter, when the scanning line 26 is deselected, the TFT 24 is turned OFF, and the data voltage charged in the holding capacity 23 stays. An electric current based on the voltage flows to the driving TFT 22, and this current causes the organic EL device 21 to emit light. However, when the TFT 24 changes its state from ON to OFF, a level shift occurs as does in the previous preferred embodiments due to the parasitic capacity Cgs2 in the TFT 24. This means that if separate exposure was performed at the time of manufacture which left pattern misalignment of different extent in the segmented regions, the shift will cause such a phenomenon as emission luminance differing from one segmented region to another (block segmentation), i.e. poor display quality. In such a pixel circuit, a portion indicated by symbol "A" represents a voltage holding electrode for forming the holding capacitor 23, and the data line "data" is connected with the voltage holding electrode (A) via the TFT 24. The TFT 24 is turned ON/OFF by the scanning line 25, and the parasitic capacity Cgs2 in the TFT 24 corresponds to the parasitic capacity Cgd in the TFT 102 of the pixel circuit according to the first and the second preferred embodiments. Therefore, the present invention is applicable also to active matrix substrates for organic EL display device which has a pixel circuit of the configuration shown in FIG. 25, in order to average increase/decrease in the parasitic capacity Cgs2 and resulting increase/decrease in the level shift due to pattern misalignment made at the time of manufacture.

Active matrix substrates used in a liquid crystal display device such as those used in the above-described preferred embodiments are AC-driven. However, the present invention is also applicable to DC-driven active matrix substrates used in, e.g., organic EL display devices, and can average increase/decrease in the parasitic capacity Cgd caused by pattern misalignment and resulting increase/decrease in the level shift $\Delta Vd$ of the pixel electric potential, and thereby reduce block segmentation and other problems. Further, the present invention is not limited to active matrix substrates used in display devices, but is also applicable to those active matrix substrates used in image sensors, fingerprint sensors, etc. In these cases, application of the present invention enables to reduce occurrence of those phenomena which are equivalent to block segmentation caused by pattern misalignment resulting from separate exposure performed at the time of manufacture, when reading, e.g., an image using a pixel array constituted by a plurality (M times N) of pixel circuits as described.

The present invention is suitable for application to active matrix substrates or drive circuit therefor used in display devices, sensors, etc. In particular, the present invention is suitable for active matrix substrates in liquid crystal display devices and EL display devices.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed:

1. An active matrix substrate comprising:
    a plurality of data signal lines;
    a plurality of scanning signal lines intersecting with the data signal lines; and
    a pixel array including a plurality of pixels disposed in a matrix pattern correspondingly to the respective intersections defined by intersecting ones of the data signal lines and the scanning signal lines; wherein
    each of the plurality of pixels includes:
        a first transistor having a first structure; and
        a second transistor having a second structure that is different from the first structure with respect to an arrangement or orientation of elements of the first transistor and the second transistor; and
    the first and second transistors are disposed alternately with respect to each other in a row direction and a column direction in the pixel array.

2. An active matrix substrate according to claim 1, wherein:
    each of the first and second transistors includes a drain electrode and a gate electrode; and
    a first positional relationship between the drain electrode and the gate electrode of the first transistor is different than a second positional relationship between the drain electrode and the gate electrode of the second transistor.

3. An active matrix substrate according to claim 1, wherein the arrangement or orientation of elements of the first transistor and the second transistor is such that an increase or decrease in a value of gate-drain parasitic capacity caused by pattern misalignment is opposite to each other in the first and second transistors.

4. An active matrix substrate according to claim 1, wherein:
    each of the first and second transistors includes a drain electrode, a gate electrode and a source electrode;
    the drain electrode of the first transistor is located on a first side of the gate electrode of the first transistor in a plan view of the active matrix substrate and overlaps the gate electrode of the first transistor; and
    the drain electrode of the second transistor is located on a second side, opposite to the first side, of the gate electrode of the second transistor in a plan view of the active matrix substrate and overlaps the gate electrode of the second transistor.

5. An active matrix substrate according to claim 1, wherein the first side is an upper side and the second side is a lower side.

6. An active matrix substrate according to claim 4, wherein the first side is a left side and the second side is a right side.

7. An active matrix substrate according to claim 1, wherein the first and second transistors are disposed in a substantially uniform arrangement in the pixel array.

8. An active matrix substrate according to claim 3, wherein the first and second transistors are arranged in a reverse relationship with respect to each other in terms of an increase or decrease in the parasitic capacity due to pattern misalignment.

9. An active matrix substrate according to claim 1, wherein the first and second transistors are arranged in the array to perform one of line inversion driving, 1H dot inversion driving, and 2H dot inversion driving.

10. A display device comprising the active matrix substrate according to claim 1.

11. A display device according to claim 10, wherein the display device is one of a liquid crystal display device or an electroluminescent display device.

12. An active matrix substrate comprising:
    a plurality of data signal lines;
    a plurality of scanning signal lines intersecting with the data signal lines; and
    a pixel array including a plurality of pixel circuits disposed in a matrix pattern correspondingly to the respective intersections defined by intersecting ones of the data signal lines and the scanning signal lines; wherein
    each of the plurality of pixel circuits includes:
        a first transistor including a gate electrode, a source electrode, and a drain electrode; and
        a second transistor including a gate electrode, a source electrode, and a drain electrode;
    the source electrodes of the first transistor and the second transistor are substantially C-shaped or substantially U-shaped;
    an orientation of the substantially C-shaped or substantially U-shaped source electrode of the first transistor is different from an orientation of the substantially C-shaped or substantially U-shaped source electrode of the second transistor; and
    the first and second transistors are disposed alternately with respect to each other in a row direction and a column direction in the pixel array.

13. An active matrix substrate according to claim 12, wherein the orientation of the substantially C-shaped or substantially U-shaped source electrode of the first transistor is opposite to the orientation of the substantially C-shaped or substantially U-shaped source electrode of the second transistor.

14. An active matrix substrate according to claim 12, wherein:
    the drain electrode of the first transistor includes a portion that extends into an area surrounded by the substantially C-shaped or substantially U-shaped source electrode of the first transistor; and
    the drain electrode of the second transistor includes a portion that extends into an area surrounded by the substantially C-shaped or substantially U-shaped source electrode of the second transistor.

15. An active matrix substrate according to claim 12, wherein the gate electrode and the drain electrode of the first transistor and the gate electrode and the drain electrode of the second transistor are arranged such that an increase or decrease in a value of gate-drain parasitic capacity caused by pattern misalignment is opposite to each other in the first and second transistors.

16. An active matrix substrate according to claim 12, wherein:
    the drain electrode of the first transistor is located on a first side of the gate electrode of the first transistor in a plan view of the active matrix substrate and overlaps the gate electrode of the first transistor; and
    the drain electrode of the second transistor is located on a second side, opposite to the first side, of the gate electrode of the second transistor in a plan view of the active matrix substrate and overlaps the gate electrode of the second transistor.

17. An active matrix substrate according to claim 16, wherein the first side is an upper side and the second side is a lower side.

18. An active matrix substrate according to claim 16, wherein the first side is a left side and the second side is a right side.

19. An active matrix substrate according to claim 12, wherein the first and second transistors are disposed in a substantially uniform arrangement in the pixel array.

20. An active matrix substrate according to claim 12, wherein the first and second transistors are arranged in a reverse relationship with respect to each other in terms of an increase/decrease in the parasitic capacity due to pattern misalignment.

21. An active matrix substrate according to claim 20, wherein the first and second transistors are arranged in the array to perform one of line inversion driving, 1H dot inversion driving, and 2H dot inversion driving.

22. A display device comprising the active matrix substrate according to claim 12.

23. A display device according to claim 22, wherein the display device is one of a liquid crystal display device or an electroluminescent display device.

24. An active matrix substrate comprising:
   a plurality of data signal lines;
   a plurality of scanning signal lines intersecting with the data signal lines; and
   a pixel array including a plurality of pixels disposed in a matrix pattern correspondingly to the respective intersections defined by intersecting ones of the data signal lines and the scanning signal lines; wherein
   each of the plurality of pixels includes:
      a first transistor including a first source electrode, a first drain electrode, and a first gate electrode arranged to define a first overlap region in which the first drain electrode and the first gate electrode overlap each other; and
      a second transistor including a second source electrode, a second drain electrode, and a second gate electrode arranged to define a second overlap region in which the second drain electrode and the second gate electrode overlap each other;
   the first drain electrode, the first gate electrode, the second drain electrode, and the second gate electrode are arranged such that an increase or decrease in the first overlap region caused by any pattern misalignment is offset by a corresponding decrease or increase in the second overlap region; and
   the first and second transistors are disposed alternately with respect to each other in a row direction and a column direction in the pixel array.

25. An active matrix substrate according to claim 4, wherein:
   each of the plurality of pixels includes at least a first sub-pixel and a second sub-pixel; and
   in each of the plurality of pixels, the first sub-pixel is connected to the first transistor and the second sub-pixel is connected to the second transistor.

26. An active matrix substrate according to claim 12, wherein:
   each of the plurality of pixel circuits includes at least a first sub-pixel and a second sub-pixel; and
   in each of the plurality of pixel circuits, the first sub-pixel is connected to the first transistor and the second sub-pixel is connected to the second transistor.

* * * * *